United States Patent
Heaton

(10) Patent No.: US 11,668,850 B2
(45) Date of Patent: *Jun. 6, 2023

(54) NUCLEAR MAGNETIC RESONANCE DATA ACQUISITION SYSTEM

(71) Applicant: Schlumberger Technology Corporation, Sugar Land, TX (US)

(72) Inventor: Nicholas Heaton, Cambridge (GB)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,785

(22) Filed: Apr. 4, 2022

(65) Prior Publication Data

US 2022/0229203 A1    Jul. 21, 2022

Related U.S. Application Data

(63) Continuation of application No. 16/976,199, filed as application No. PCT/US2019/020177 on Mar. 1, 2019, now Pat. No. 11,294,093.

(60) Provisional application No. 62/636,964, filed on Mar. 1, 2018.

(51) Int. Cl.
*G01V 3/32* (2006.01)
*G01R 33/44* (2006.01)
*E21B 47/12* (2012.01)

(52) U.S. Cl.
CPC ............... *G01V 3/32* (2013.01); *E21B 47/12* (2013.01); *G01R 33/448* (2013.01)

(58) Field of Classification Search
CPC ................................ G01R 33/448; G01V 3/32
See application file for complete search history.

(56) References Cited

U.S. PATENT DOCUMENTS

| | | | |
|---|---|---|---|
| 5,023,551 A | 6/1991 | Kleinberg et al. |
| 6,121,774 A | 9/2000 | Sun et al. |
| 6,204,663 B1 | 3/2001 | Prammer |
| 6,392,409 B1 | 5/2002 | Chen |
| 6,525,534 B2 | 2/2003 | Akkurt et al. |
| 6,541,969 B2 | 4/2003 | Sigal et al. |
| 7,126,333 B2 | 10/2006 | Beard et al. |
| 7,804,297 B2 | 9/2010 | Romero |
| 8,581,587 B2 | 11/2013 | Walsh et al. |
| 10,466,381 B2 | 11/2019 | Coman |

(Continued)

FOREIGN PATENT DOCUMENTS

WO    2011071796 A2    6/2011

OTHER PUBLICATIONS

International Search Report and Written Opinion issued in International Patent application PCT/US2019/020177 dated May 30, 2019, 11 pages.

*Primary Examiner* — Gregory H Curran
(74) *Attorney, Agent, or Firm* — Jeffrey D. Frantz

(57) ABSTRACT

A method can include controlling radio frequency emission circuitry of a nuclear magnetic resonance unit to emit radio frequency energy according to a first set of parameters that comprises a first wait time for an even number of sequence repeats with positive and negative phases and to emit radio frequency energy according to a second set of parameters that includes a second wait time for a single sequence with a single phase, where the second wait time is greater than the first wait time; and acquiring, via antenna circuitry and analog-to-digital conversion circuitry, nuclear magnetic resonance.

20 Claims, 21 Drawing Sheets

(56) References Cited

U.S. PATENT DOCUMENTS

| | | |
|---|---|---|
| 2005/0231198 A1 | 10/2005 | Beard et al. |
| 2006/0272812 A1 | 12/2006 | Yu et al. |
| 2012/0235677 A1 | 9/2012 | Blanz et al. |
| 2015/0054503 A1 | 2/2015 | Chen et al. |
| 2016/0116629 A1 | 4/2016 | Coman et al. |
| 2021/0003734 A1 | 1/2021 | Heaton |

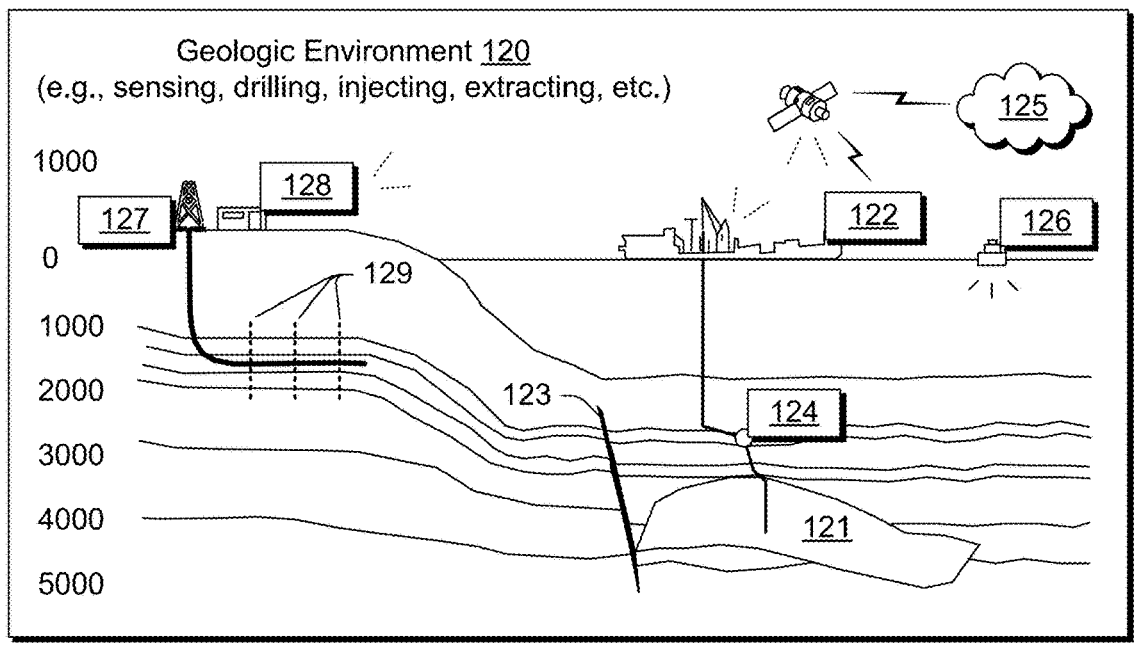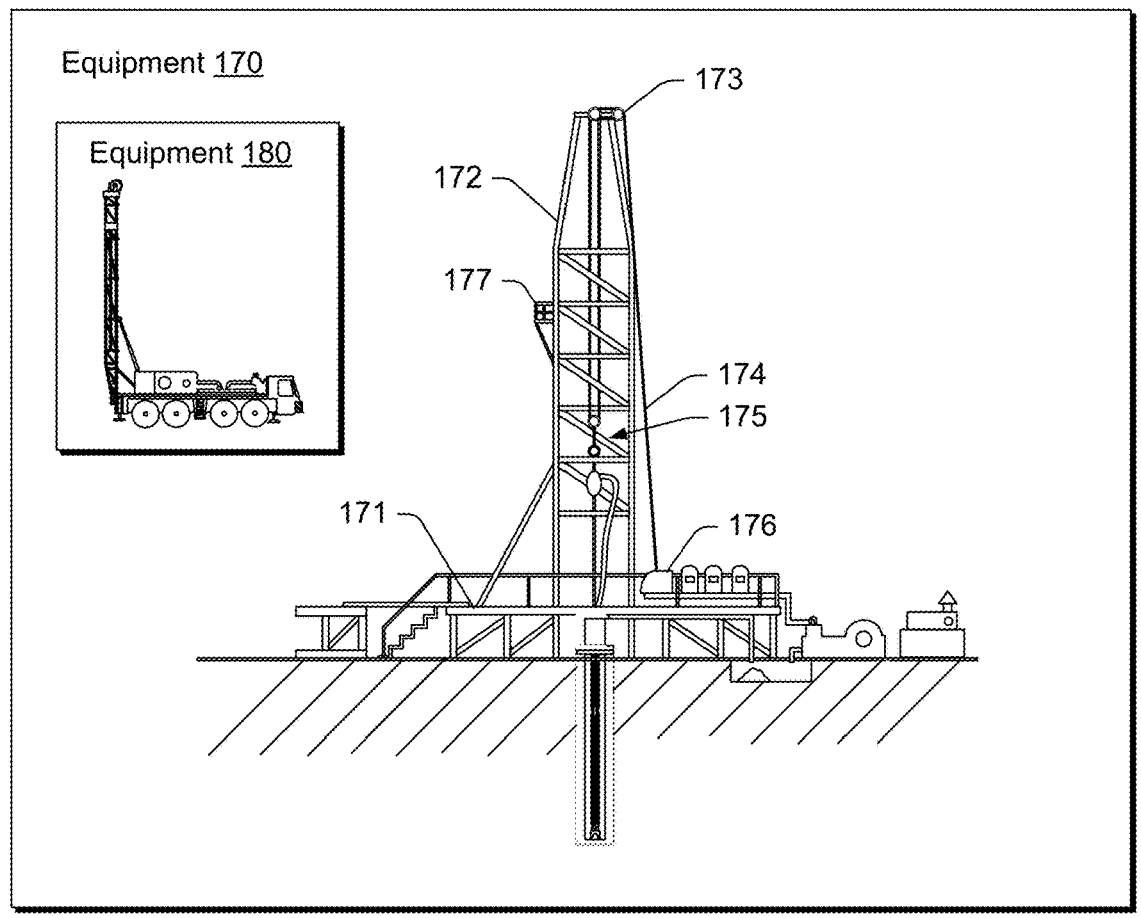
Fig. 1

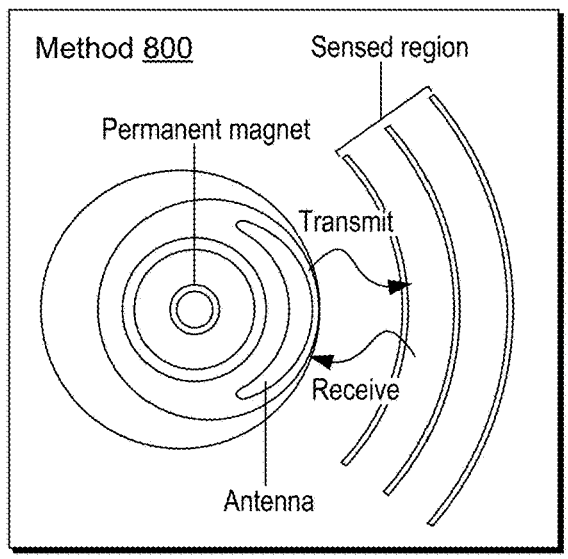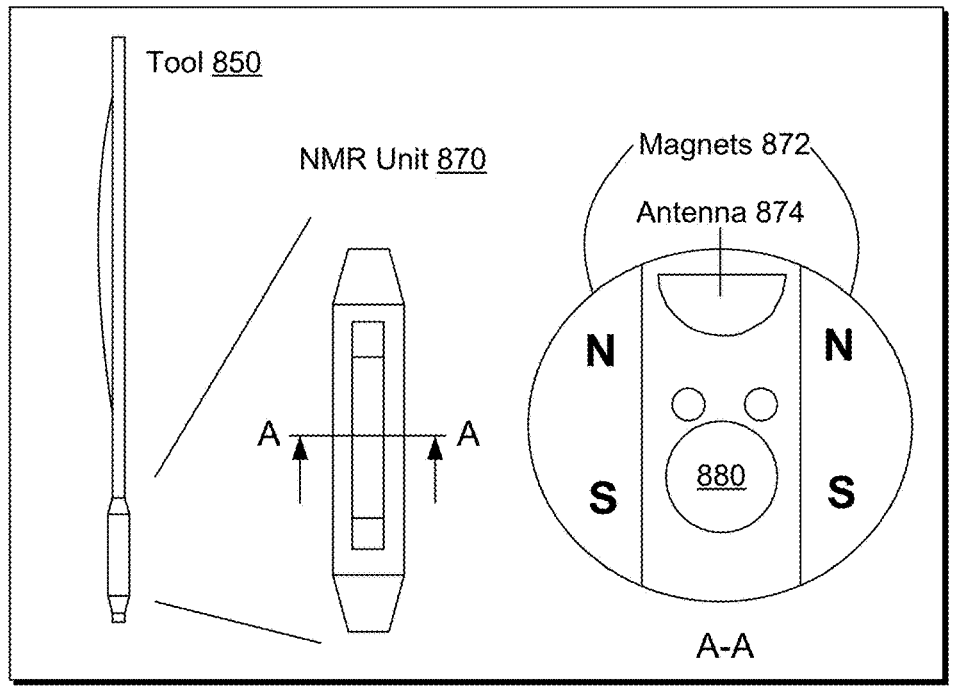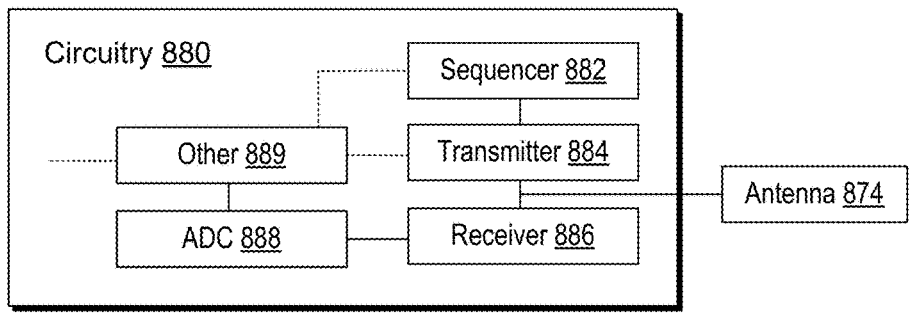
Fig. 8

Method 1100

Control radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time
1110

CRM 1111

Acquire, via antenna circuitry and analog-to-digital conversion circuitry, nuclear magnetic resonance echoes as digital echo data during and responsive to each of the sequences
1120

CRM 1121

Invert the digital echo data to determine at least one T1 value using the first wait time, the second wait time and a combination of the digital echo data for the first wait time and the second wait time
1130

CRM 1131

Characterize a formation using the at least one T1 value
1140

CRM 1141

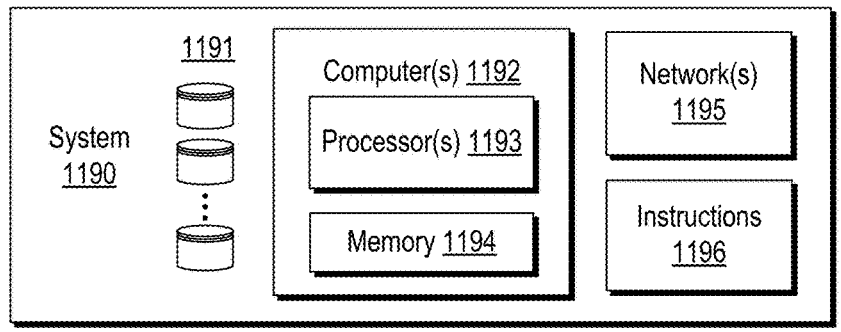

Fig. 11

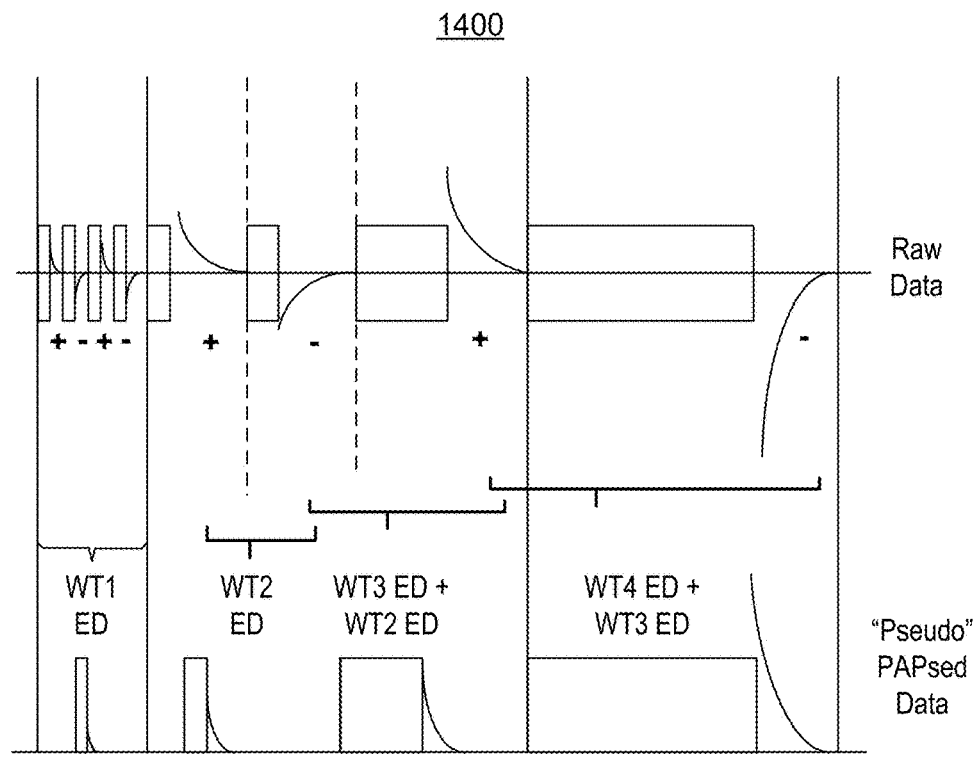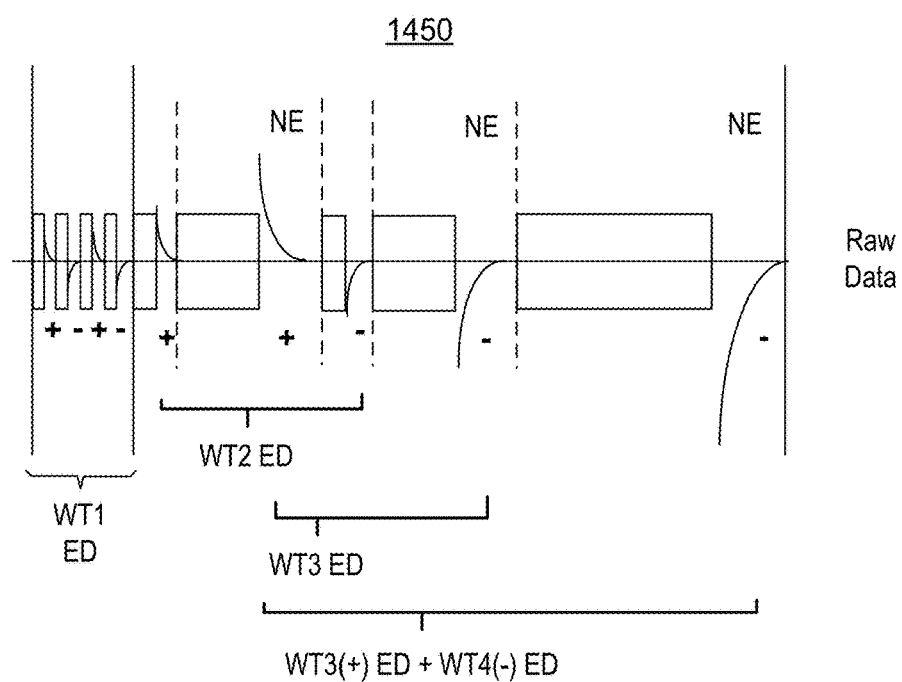
Fig. 14

Table 1500

| Segment | 1 | 2 | 3 | 4 | 5 | 6 |
|---|---|---|---|---|---|---|
| WT(ms) | 6000 | 1000 | 256 | 64 | 16 | 4 |
| TE(ms) | 1 | 1 | 0.8 | 0.6 | 0.6 | 0.5 |
| NE | 1024 | 1024 | 256 | 64 | 16 | 8 |
| NR | 1 | 2 | 4 | 16 | 128 | 64 |

Fig. 15

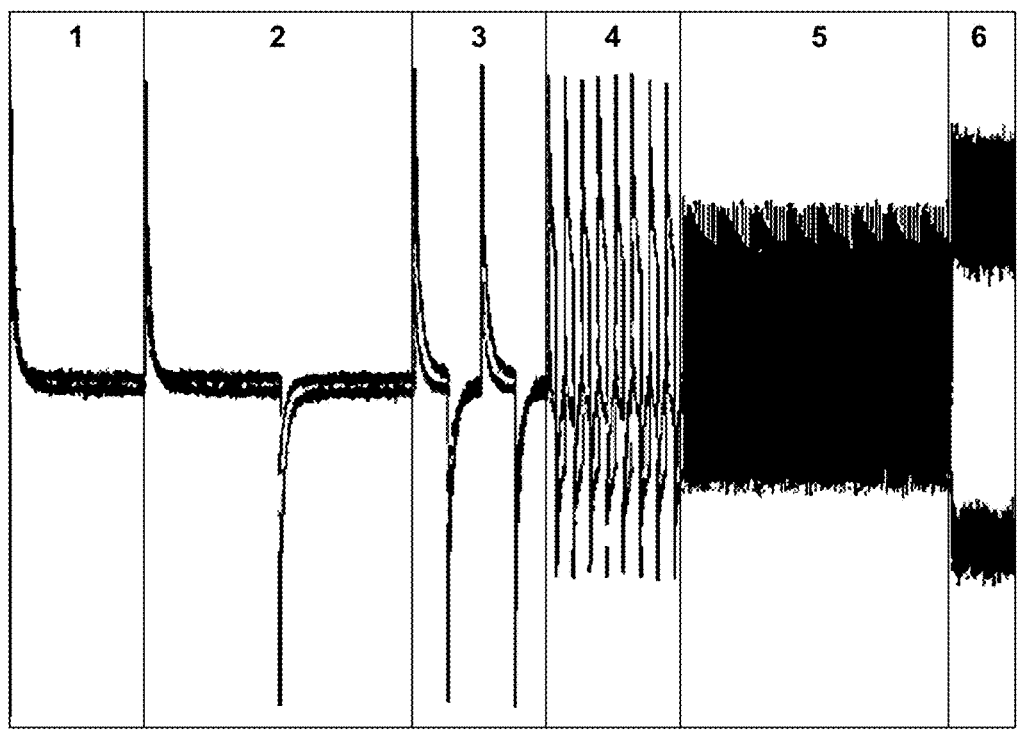
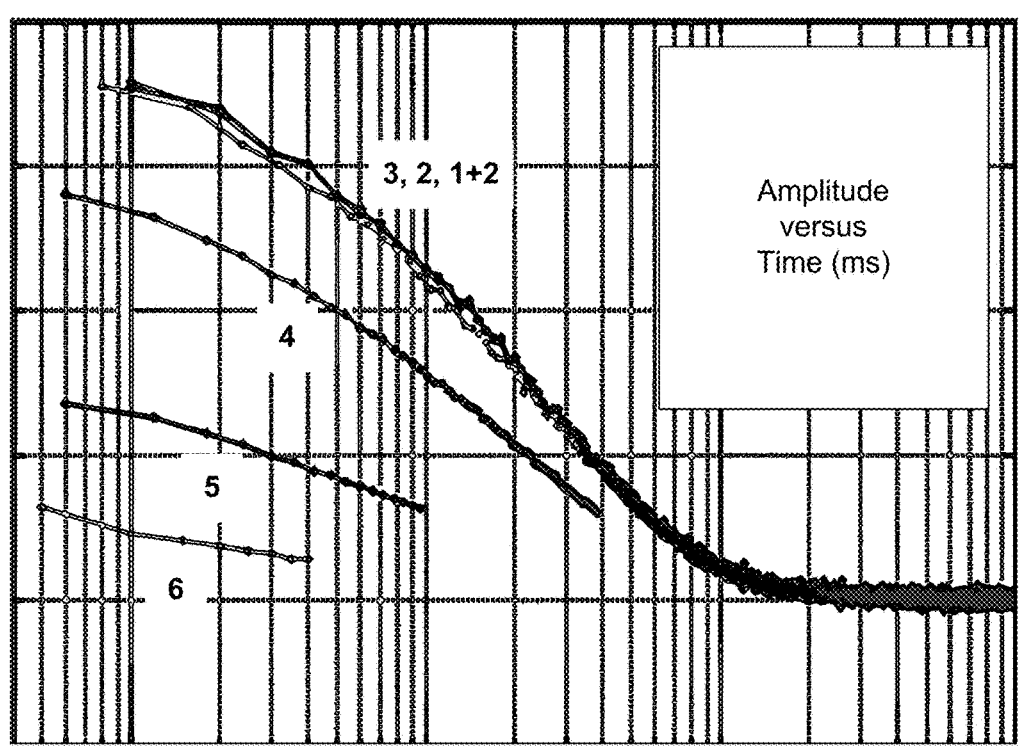
Fig. 16

NUCLEAR MAGNETIC RESONANCE DATA ACQUISITION SYSTEM

RELATED APPLICATIONS

This application is a continuation of U.S. application Ser. No. 16/976,199, filed Aug. 27, 2020, which was the National Stage of International Application No. PCT/US2019/020177, filed Mar. 1, 2019, which claims priority to and the benefit of a U.S. Provisional Application No. 62/636,964, filed Mar. 1, 2018. Each patent application identified above is incorporated by reference herein in its entirety.

BACKGROUND

Nuclear magnetic resonance can be utilized to determine properties of objects, substances or objects and substances. For example, an object can be a formation that includes one or more substances, which may be present in one or more forms. As an example, a substance can include protons (e.g., $H^1$), which can be aligned using a static magnetic field and altered using an oscillating magnetic field. Responses of the protons to alteration can be acquired as signals, which can be processed to determine properties such as relaxation properties.

Relaxation pertains to restoration of a state, which may be an equilibrium state, or otherwise going back to a low-energy level after excitation. One relaxation property is spin-lattice (longitudinal) or T1 relaxation, which is a process by which longitudinal magnetization is recovered (e.g., after an excitation pulse is applied) due to transfer of energy from a nuclear spin system to neighboring molecules (e.g., the lattice). The T1 relaxation time (or simply T1) is a measure of the rate of transfer of energy from the nuclear spin system to the neighboring molecules (e.g., the lattice). T1 can be defined as the time when approximately 63 percent of the longitudinal magnetization has recovered. Another relaxation property is spin-spin (transverse) or T2 relaxation, which is a process by which transverse magnetization decays due to dephasing of proton spins (e.g., spins becoming desynchronized). Responsive to application of an excitation pulse, magnetization can be altered by 90 degrees from a longitudinal axis (e.g., z-axis) into a plane (e.g., x, y-plane). The transverse magnetization can be initially at a maximum (e.g., due to coherent nuclear spins); however, coherence gradually diminishes due to field inhomogeneities and/or direct interactions between the spins (e.g., without energy transfer to the lattice). T2 relaxation occurs in the plane and may be depicted as the spreading of magnetic moments along the plane (e.g., some faster and some slower). The T2 relaxation time (or simply T2) is a measure of the rate of the decay of transverse magnetization within the plane. T2 can be defined as the time when approximately 63 percent of the transverse magnetization has decayed.

SUMMARY

A method can include controlling radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; and acquiring, via antenna circuitry and analog-to-digital conversion circuitry, nuclear magnetic resonance. A system can include a processor; memory accessible to the processor; processor-executable instructions stored in the memory and executable by the processor to instruct the system to: control radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; and acquire, via antenna circuitry and analog-to-digital conversion circuitry, nuclear magnetic resonance echoes as digital echo data during and responsive to each of the sequences. One or more computer-readable storage media can include computer-executable instructions executable to instruct a computing system to: control radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; and acquire, via antenna circuitry and analog-to-digital conversion circuitry, nuclear magnetic resonance echoes as digital echo data during and responsive to each of the sequences. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates examples of equipment in a geologic environment;

FIG. 8 illustrates an example of a method and an example of a tool;

FIG. 11 illustrates an example of a method and an example of a system;

FIG. 14 illustrates examples of pseudo-PAPs methods;

FIG. 15 illustrates an example of a table of examples of values of parameters for an acquisition scheme;

FIG. 16 illustrates examples of plots of data and data derived from a logging operation using the acquisition scheme of FIG. 15;

DETAILED DESCRIPTION

Figure 2:
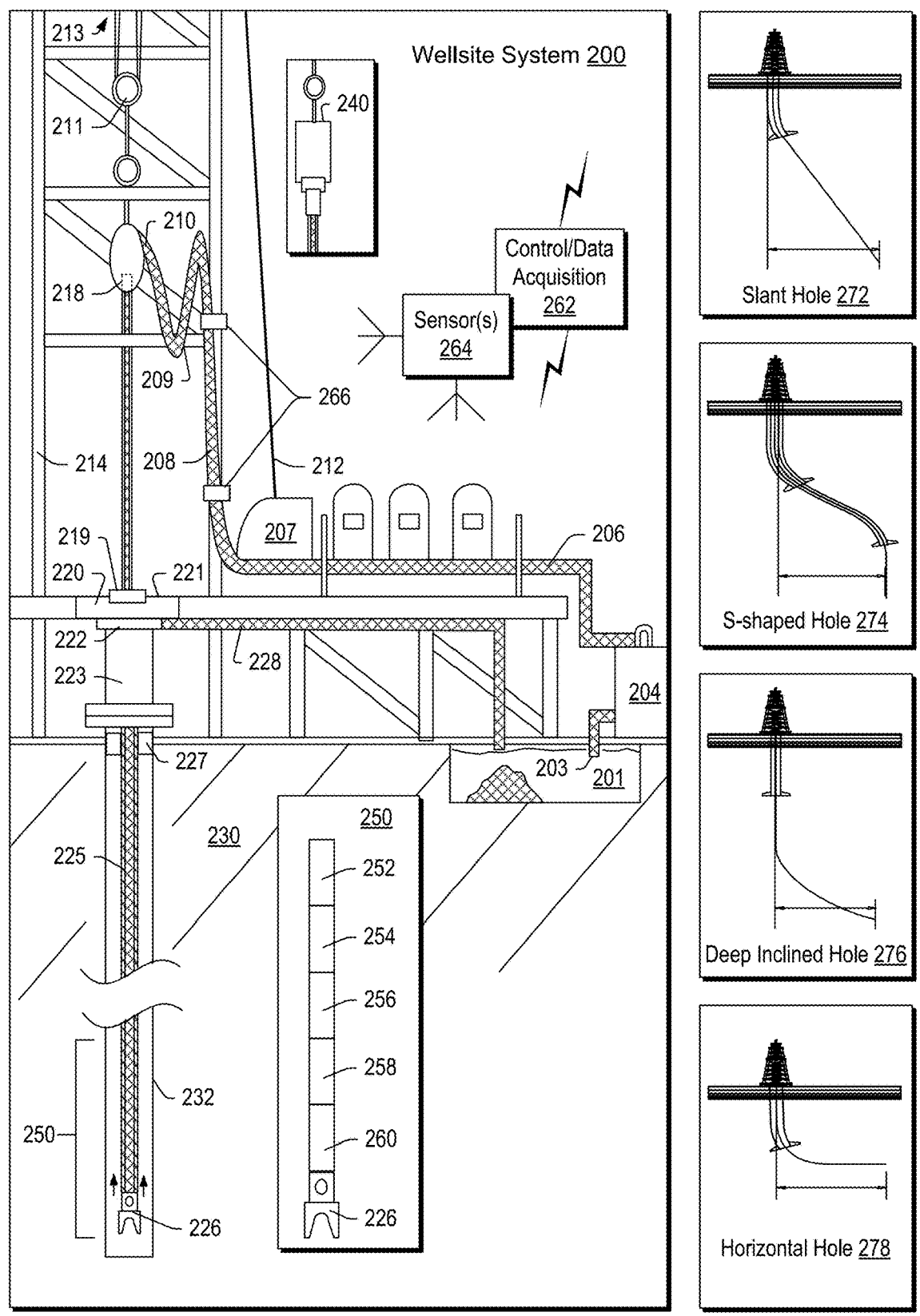
FIG. 2 illustrates an example of a system and examples of types of holes.

The following description includes embodiments of the best mode presently contemplated for practicing the described implementations. This description is not to be taken in a limiting sense, but rather is made merely for the purpose of describing the general principles of the implementations. The scope of the described implementations should be ascertained with reference to the issued claims.

Various operations can be performed in a field. For example, consider exploration as an initial phase in petroleum operations that includes generation of a prospect or play or both, and drilling of an exploration well or borehole. Appraisal, development and production phases may follow successful exploration.

A borehole may be referred to as a wellbore and can include an openhole portion or an uncased portion and/or may include a cased portion. A borehole may be defined by a bore wall that is composed of a rock that bounds the borehole.

As to a well or a borehole, whether for one or more of exploration, sensing, production, injection or other operation(s), it can be planned. Such a process may be referred to generally as well planning, a process by which a path can be mapped in a geologic environment. Such a path may be referred to as a trajectory, which can include coordinates in a three-dimensional coordinate system where a measure along the trajectory may be a measured depth, a total vertical depth or another type of measure. During drilling, wireline investigations, etc., equipment may be moved into and/or out of a well or borehole. Such operations can occur over time and may differ with respect to time. As an example, drilling can include using one or more logging tools that can perform one or more logging operations while drilling or otherwise with a drillstring (e.g., while stationary, while tripping in, tripping out, etc.). As an example, a wireline operation can include using one or more logging tools that can perform one or more logging operations. A planning process may call for performing various operations, which may be serial, parallel, serial and parallel, etc.

As an example, a well plan can be generated based at least in part on imposed constraints and known information. As an example, a well plan may be provided to a well owner, approved, and then implemented by a drilling service provider (e.g., a directional driller or "DD"). In such an example, a rig may be used to drill, for example, according to a well plan. During a period of time during which a well plan is implemented, a rig may transition from one state to another state, which may be referred to as rigstates. As an example, a state may be a drilling state or may be a state where drilling into a formation (e.g., rock) is not occurring (e.g., an idle state, a tripping-in state, a tripping-out state, etc.).

As an example, a well design system can account for one or more capabilities of a drilling system or drilling systems that may be utilized at a wellsite. As an example, a drilling engineer may be called upon to take such capabilities into account, for example, as one or more of various designs and specifications are created. As an example, a state such as a rigstate may correspond to a capability, for example, while the capability is being utilized.

As an example, a well design system, which may be a well planning system, may take into account automation. For example, where a wellsite includes wellsite equipment that can be automated, for example, via a local and/or a remote automation command, a well plan may be generated in digital form that can be utilized in a well drilling system where at least some amount of automation is possible and desired. For example, a digital well plan can be accessible by a well drilling system where information in the digital well plan can be utilized via one or more automation mechanisms of the well drilling system to automate one or more operations at a wellsite.

As an example, drilling or one or more other operations may occur responsive to measurements. For example, a logging while drilling operation may acquire measurements and adjust drilling based at least in part on such measurements. As an example, a logging operation can include moving a logging tool, stopping a logging tool, or otherwise controlling a logging tool based at least in part on measurements acquired by the logging tool or, for example, another logging tool (e.g., sensor unit, etc.).

As explained, a nuclear magnetic resonance (NMR) can be utilized to determine properties of objects, substances or objects and substances. In various operations, a downhole tool can include one or more NMR units that can acquire NMR measurements. Such measurements may provide for characterization of one or more objects, one or more substances, etc. Such measurements may be acquired using wireline technology, drilling technology (e.g., logging while drilling, etc.), or other downhole technology. As an example, NMR technology can be utilized in a geologic environment to characterize the geologic environment (e.g., formation characterization, fluid characterization, etc.).

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with a variety of sensors, detectors, actuators, etc. For example, equipment 122 may include communication circuitry to receive and/or to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, geolocation, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, NMR logging, assessment of one or more fractures, injection, production, etc. As an example, the equipment 127 and/or 128 may provide for measurement, collection, communication, storage, analysis, etc. of data such as, for example, formation data, fluid data, production data (e.g., for one or more produced resources), etc. As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system. As shown in FIG. 1, the equipment 180 can be mobile as carried by a vehicle; noting that the equipment 170 can be assembled, disassembled, transported and re-assembled, etc.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrick person may be a rig crew member that works on a platform attached to a derrick or a mast. A derrick can include a landing on which a derrick person may stand. As an example, such a landing may be about 10 meters or more above a rig floor. In an operation referred to as trip out of the hole (TOH), a derrick person may wear a safety harness that enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrick person controls the machinery rather than physically handling the pipe.

As an example, a trip may refer to the act of pulling equipment from a bore and/or placing equipment in a bore. As an example, equipment may include a drillstring that can be pulled out of the hole and/or place or replaced in the hole. As an example, a pipe trip may be performed where a drill bit has dulled or has otherwise ceased to drill efficiently and is to be replaced.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid that may help to transport cuttings, etc.), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling or one or more other types of drilling.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the platform 215 and the derrick 214 positioned over the borehole 232. As mentioned, the wellsite system 200 can include the rotary table 220 where the drillstring 225 passes through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drillstring 225 may be pulled from a wellbore and optionally replaced, for example, with a new or sharpened drill bit, a smaller diameter drillstring, etc. As mentioned, the act of pulling a drillstring out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drillstring 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more components of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measurement-while-drilling (MWD) module 256, an optional module 258, a rotary-steerable system (RSS) and/or motor 260, and the drill bit 226. Such components or modules may be referred to as tools where a drillstring can include a plurality of tools.

As to a RSS, it involves technology utilized for direction drilling. Directional drilling involves drilling into the Earth to form a deviated bore such that the trajectory of the bore is not vertical; rather, the trajectory deviates from vertical along one or more portions of the bore. As an example, consider a target that is located at a lateral distance from a surface location where a rig may be stationed. In such an example, drilling can commence with a vertical portion and then deviate from vertical such that the bore is aimed at the target and, eventually, reaches the target. Directional drilling may be implemented where a target may be inaccessible from a vertical location at the surface of the Earth, where material exists in the Earth that may impede drilling or otherwise be detrimental (e.g., consider a salt dome, etc.), where a formation is laterally extensive (e.g., consider a relatively thin yet laterally extensive reservoir), where multiple bores are to be drilled from a single surface bore, where a relief well is desired, etc.

One approach to directional drilling involves a mud motor; however, a mud motor can present some challenges depending on factors such as rate of penetration (ROP), transferring weight to a bit (e.g., weight on bit, WOB) due to friction, etc. A mud motor can be a positive displacement motor (PDM) that operates to drive a bit during directional drilling. A PDM operates as drilling fluid is pumped through it where the PDM converts hydraulic power of the drilling fluid into mechanical power to cause the bit to rotate. A PDM can operate in a so-called sliding mode, when the drillstring is not rotated from the surface.

A RSS can drill directionally where there is continuous rotation from surface equipment, which can alleviate the sliding of a steerable motor (e.g., a PDM). A RSS may be deployed when drilling directionally (e.g., deviated, horizontal, or extended-reach wells). A RSS can aim to minimize interaction with a borehole wall, which can help to preserve borehole quality. A RSS can aim to exert a relatively consistent side force akin to stabilizers that rotate with the drillstring or orient the bit in the desired direction while continuously rotating at the same number of rotations per minute as the drillstring.

The LWD module 254 may be housed in a suitable type of drill collar and can contain one or a plurality of selected types of logging tools (e.g., NMR unit or units, etc.). It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device, a NMR measuring device, etc.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform method such as geosteering. As mentioned, a steerable system can be or include an RSS. As an example, a steerable system can include a PDM or of a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; a combinable magnetic resonance (CMR) tool for measuring properties (e.g., relaxation properties, etc.); one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium. As an example, data acquired by a NMR unit may be processed in a manner that can reduce data load, which can facilitate transmission. For example, consider downhole processing of NMR measurements to reduce a total number of bits to be transmitted (e.g., consider downhole data compression, downhole data analysis, etc.).

As mentioned, a drillstring can include various tools that may make measurements. As an example, a wireline tool or another type of tool may be utilized to make measurements. As an example, a tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG framework. As an example, the TECHLOG framework can be interoperable with one or more other frameworks such as, for example, the PETREL framework.

Figure 3:
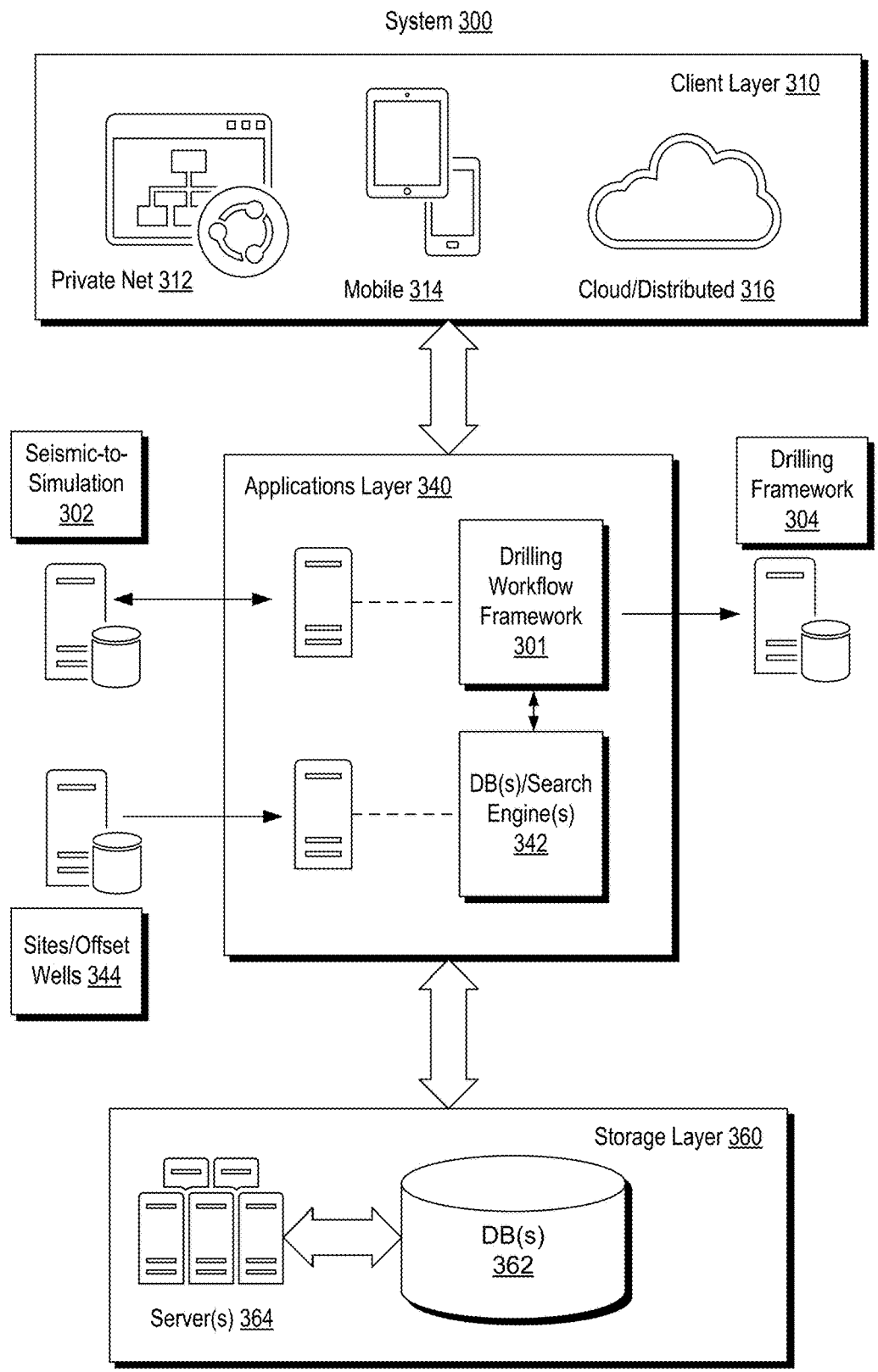
FIG. 3 illustrates an example of a system.

FIG. 3 shows an example of a system 300 that includes a drilling workflow framework 301, a seismic-to-simulation framework 302, a drilling framework 304, a client layer 310, an applications layer 340 and a storage layer 360. As shown the client layer 310 can be in communication with the applications layer 340 and the applications layer 340 can be in communication with the storage layer 360. In such an example, a computational framework may be provided for handling of logging measurements and/or data derived from logging measurements. For example, logging information may be provided to the seismic-to-simulation framework 302 and/or to the drilling framework 304. Such information may be utilized for model building (e.g., constructing a multidimensional model of a geologic environment), generating a trajectory for a well (e.g., or an extension thereof), generating a stimulation plan (e.g., fracturing, chemical treatment, etc.), controlling one or more drilling operations, etc.

In the example of FIG. 3, the client layer 310 can include features that allow for access and interactions via one or more private networks 312, one or more mobile platforms and/or mobile networks 314 and via the "cloud" 316, which may be considered to include distributed equipment that forms a network such as a network of networks.

In the example of FIG. 3, the applications layer 340 includes the drilling workflow framework 301. The applications layer 340 also includes a database management component 342 that includes one or more search engine features (e.g., sets of executable instructions to perform various actions, etc.).

As an example, the database management component 342 can include one or more search engine features that provide for searching one or more information that may be stored in one or more data repositories. As an example, the STUDIO E&P knowledge environment (Schlumberger Ltd., Houston, Tex.) includes STUDIO FIND search functionality, which provides a search engine. The STUDIO FIND search functionality also provides for indexing content, for example, to create one or more indexes. As an example, search functionality may provide for access to public content, private content or both, which may exist in one or more databases, for example, optionally distributed and accessible via an intranet, the Internet or one or more other networks. As an example, a search engine may be configured to apply one or more filters from a set or sets of filters, for example, to enable users to filter out data that may not be of interest.

As an example, a framework may provide for interaction with a search engine and, for example, associated features such as features of the STUDIO FIND search functionality. As an example, a framework may provide for implementation of one or more spatial filters (e.g., based on an area viewed on a display, static data, etc.). As an example, a search may provide access to dynamic data (e.g., "live" data from one or more sources), which may be available via one or more networks (e.g., wired, wireless, etc.). As an example, one or more components may optionally be implemented within a framework or, for example, in a manner operatively coupled to a framework (e.g., as an add-on, a plug-in, etc.). As an example, a component for structuring search results (e.g., in a list, a hierarchical tree structure, etc.) may optionally be implemented within a framework or, for example, in a manner operatively coupled to a framework (e.g., as an add-on, a plug-in, etc.).

In the example of FIG. 3, the applications layer 340 can include communicating with one or more resources such as, for example, the seismic-to-simulation framework 302, the drilling framework 304 and/or one or more sites, which may be or include one or more offset wellsites. As an example, the applications layer 340 may be implemented for a particular wellsite where information can be processed as part of a workflow for operations such as, for example, operations performed, being performed and/or to be performed at the particular wellsite. As an example, an operation may involve directional drilling, for example, via geosteering. As an example, an operation may involve logging via one or more downhole tools.

In the example of FIG. 3, the storage layer 360 can include various types of data, information, etc., which may be stored in one or more databases 362. As an example, one or more servers 364 may provide for management, access, etc., to data, information, etc., stored in the one or more databases 462. As an example, the database management component 342 may provide for searching as to data, information, etc., stored in the one or more databases 362.

As an example, the database management component 342 may include features for indexing, etc. As an example, information may be indexed at least in part with respect to wellsite. For example, where the applications layer 440 is implemented to perform one or more workflows associated with a particular wellsite, data, information, etc., associated with that particular wellsite may be indexed based at least in part on the wellsite being an index parameter (e.g., a search parameter).

As an example, the system 300 of FIG. 3 may be implemented to perform one or more portions of one or more workflows associated with the system 200 of FIG. 2. As an example, the drilling workflow framework 301 may interact with a technical data framework (e.g., a logging data framework, etc.) and the drilling framework 304 before, during and/or after performance of one or more drilling operations. In such an example, the one or more drilling operations may be performed in a geologic environment (see, e.g., the environment 150 of FIG. 1) using one or more types of equipment (see, e.g., equipment of FIGS. 1 and 2).

As an example, an architecture utilized in a system such as, for example, the system 300 may include features of the AZURE architecture (Microsoft Corporation, Redmond, Wash.). As an example, a cloud portal block can include one or more features of an AZURE portal that can manage, mediate, etc. access to one or more services, data, connections, networks, devices, etc. As an example, the system 300 may include features of the GOOGLE cloud architecture (Google, Mountain View, Calif.).

As an example, the system 300 can include a cloud computing platform and infrastructure, for example, for building, deploying, and managing applications and services (e.g., through a network of datacenters, etc.). As an example, such a cloud platform may provide PaaS and IaaS services and support one or more different programming languages, tools and frameworks, etc.

Figure 4:
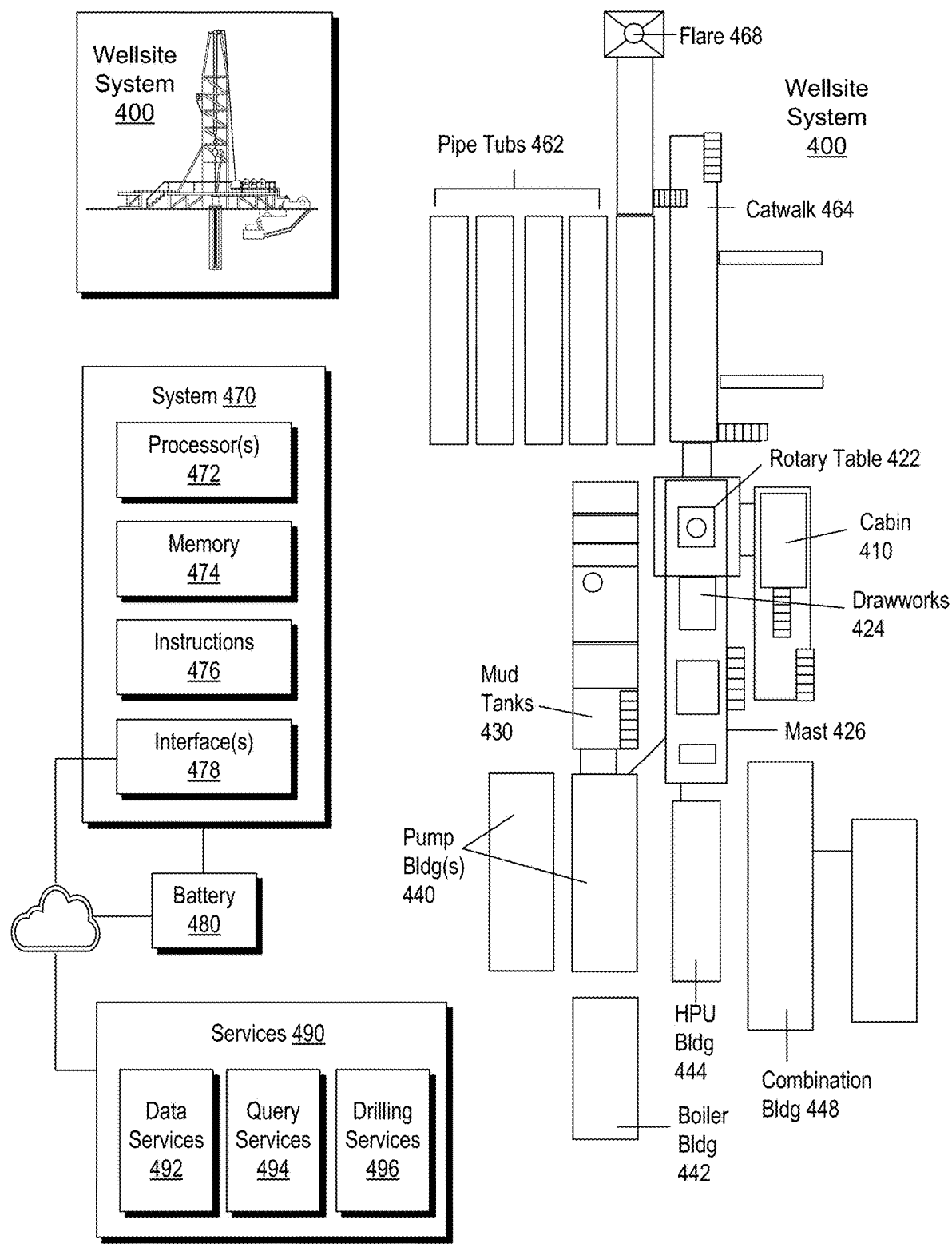
FIG. 4 illustrates an example of a system.

FIG. 4 shows an example of a wellsite system 400, specifically, FIG. 4 shows the wellsite system 400 in an approximate side view and an approximate plan view along with a block diagram of a system 470.

In the example of FIG. 4, the wellsite system 400 can include a cabin 410, a rotary table 422, drawworks 424, a mast 426 (e.g., optionally carrying a top drive, etc.), mud tanks 430 (e.g., with one or more pumps, one or more shakers, etc.), one or more pump buildings 440, a boiler building 442, an HPU building 444 (e.g., with a rig fuel tank, etc.), a combination building 448 (e.g., with one or more generators, etc.), pipe tubs 462, a catwalk 464, a flare 468, etc. Such equipment can include one or more associated functions and/or one or more associated operational risks, which may be risks as to time, resources, and/or humans.

A wellsite can include a prime mover as a source of power. As an example, a prime mover can include one to four or more diesel engines, which may produce several thousand horsepower. Such engines can be operatively coupled to one or more electric generators. Electrical power may be distributed by a silicon-controlled-rectifier (SCR) system. Rigs that convert diesel power to electricity may be referred to as electric rigs or diesel electric rigs. As an example, a rig can be configured for transmission of power from one or more diesel engines to one or more rig components (e.g., drawworks, pumps, rotary table, etc.) through mechanical belts, chains, clutches, etc. Such a configuration may be referred to a mechanical rig or a so-called "power rig".

As shown in the example of FIG. 4, the wellsite system 400 can include a system 470 that includes one or more processors 472, memory 474 operatively coupled to at least one of the one or more processors 472, instructions 476 that can be, for example, stored in the memory 474, and one or more interfaces 478. As an example, the system 470 can include one or more processor-readable media that include processor-executable instructions executable by at least one of the one or more processors 472 to cause the system 470 to control one or more aspects of the wellsite system 400. In such an example, the memory 474 can be or include the one or more processor-readable media where the processor-executable instructions can be or include instructions. As an example, a processor-readable medium can be a computer-readable storage medium that is not a signal and that is not a carrier wave.

FIG. 4 also shows a battery 480 that may be operatively coupled to the system 470, for example, to power the system 470. As an example, the battery 480 may be a back-up battery that operates when another power supply is unavailable for powering the system 470. As an example, the battery 480 may be operatively coupled to a network, which may be a cloud network. As an example, the battery 480 can include smart battery circuitry and may be operatively coupled to one or more pieces of equipment via a SMBus or other type of bus.

In the example of FIG. 4, services 490 are shown as being available, for example, via a cloud platform. Such services can include data services 492, query services 494 and drilling services 496. As an example, the services 490 may be part of a system such as the system 300 of FIG. 3.

As an example, a system such as, for example, the system 300 of FIG. 3 may be utilized to perform a workflow. Such a system may be distributed and allow for collaborative workflow interactions and may be considered to be a platform (e.g., a framework for collaborative interactions, etc.).

As an example, a workflow can commence with an evaluation stage, which may include a geological service provider evaluating a formation. As an example, a geological service provider may undertake the formation evaluation using a computing system executing a software package tailored to such activity; or, for example, one or more other suitable geology platforms may be employed (e.g., alternatively or additionally). As an example, the geological service provider may evaluate the formation, for example, using earth models, geophysical models, basin models, petrotechnical models, combinations thereof, and/or the like. Such models may take into consideration a variety of different inputs, including offset well data, seismic data, pilot well data, other geologic data, etc. The models and/or the input may be stored in the database maintained by the server and accessed by the geological service provider.

As an example, a workflow may progress to a geology and geophysics ("G&G") service provider, which may generate a well trajectory, which may involve execution of one or more G&G software packages. Examples of such software packages include the PETREL framework. As an example, a system or systems may utilize a framework such as the DELFI framework (Schlumberger Limited, Houston, Tex.). Such a framework may operatively couple various other frameworks to provide for a multi-framework workspace.

As an example, a G&G service provider may determine a well trajectory or a section thereof, based on, for example, one or more model(s) provided by a formation evaluation, and/or other data, e.g., as accessed from one or more databases (e.g., maintained by one or more servers, etc.). As an example, a well trajectory may take into consideration various "basis of design" (BOD) constraints, such as general surface location, target (e.g., reservoir) location, and the like. As an example, a trajectory may incorporate information about tools, bottom-hole assemblies, casing sizes, etc., that may be used in drilling the well. A well trajectory determination may take into consideration a variety of other parameters, including risk tolerances, fluid weights and/or plans, bottom-hole pressures, drilling time, etc.

Well planning can include determining a path of a well that can extend to a reservoir, for example, to economically produce fluids such as hydrocarbons therefrom. Well planning can include selecting a drilling and/or completion assembly which may be used to implement a well plan. As an example, various constraints can be imposed as part of well planning that can impact design of a well. As an example, such constraints may be imposed based at least in part on information as to known geology of a subterranean domain, presence of one or more other wells (e.g., actual and/or planned, etc.) in an area (e.g., consider collision avoidance), etc. As an example, one or more constraints may be imposed based at least in part on characteristics of one or more tools, components, etc. As an example, one or more constraints may be based at least in part on factors associated with drilling time and/or risk tolerance.

Figure 5:
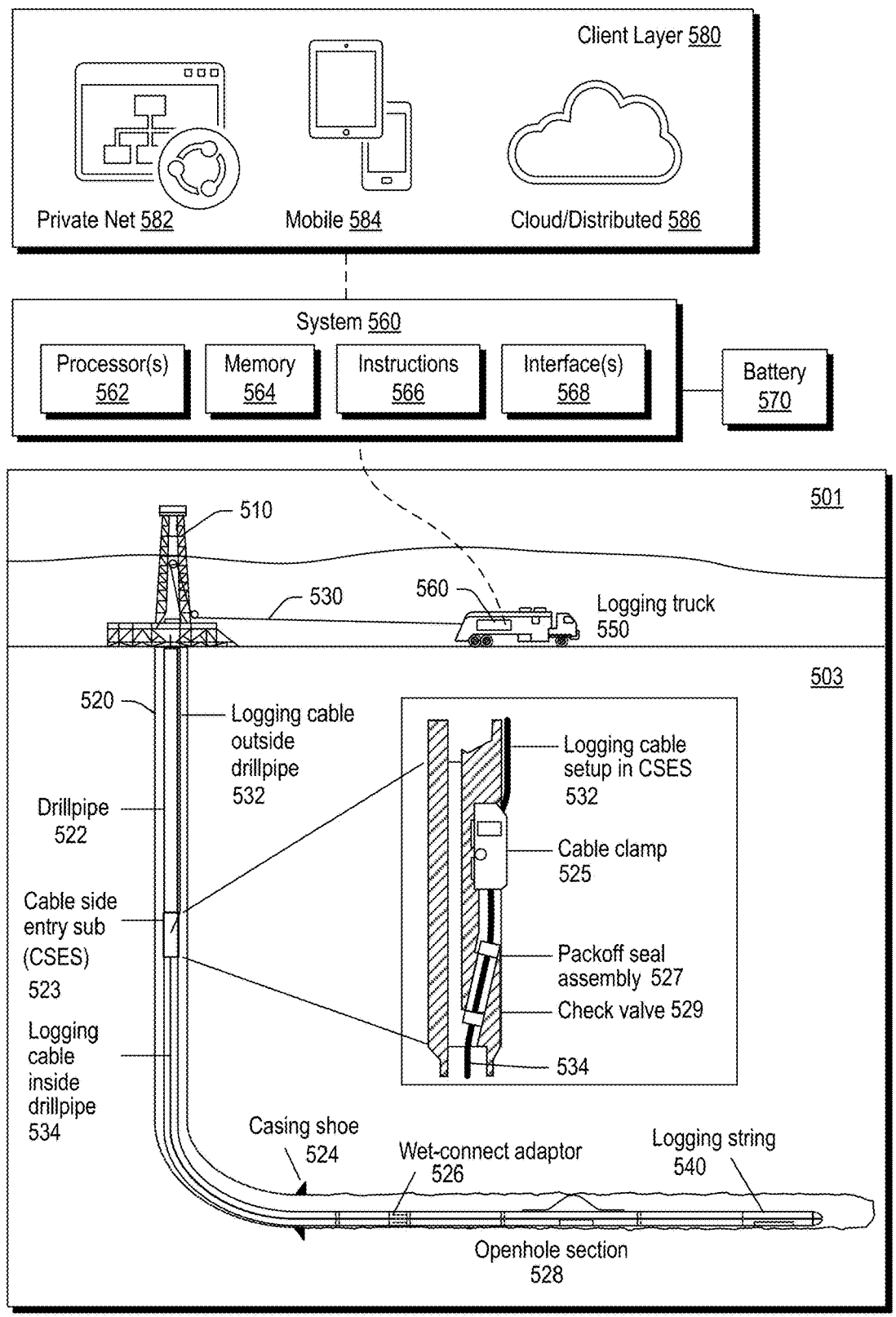
FIG. 5 illustrates an example of a system.

FIG. 5 shows an example of an environment 501 that includes a subterranean portion 503 where a rig 510 is positioned at a surface location above a bore 520. In the example of FIG. 5, various wirelines services equipment can be operated to perform one or more wirelines services including, for example, acquisition of data from one or more positions within the bore 520.

In the example of FIG. 5, the bore 520 includes drillpipe 522, a casing shoe, a cable side entry sub (CSES) 523, a wet-connector adaptor 526 and an openhole section 528. As an example, the bore 520 can be a vertical bore or a deviated bore where one or more portions of the bore may be vertical and one or more portions of the bore may be deviated, including substantially horizontal.

In the example of FIG. 5, the CSES 523 includes a cable clamp 525, a packoff seal assembly 527 and a check valve 529. These components can provide for insertion of a logging cable 530 that includes a portion 532 that runs outside the drillpipe 522 to be inserted into the drillpipe 522 such that at least a portion 534 of the logging cable runs inside the drillpipe 522. In the example of FIG. 5, the logging cable 530 runs past the wet-connect adaptor 526 and into the openhole section 528 to a logging string 540.

As shown in the example of FIG. 5, a logging truck 550 (e.g., a wirelines services vehicle) can deploy the wireline 530 under control of a system 560. As shown in the example of FIG. 5, the system 560 can include one or more processors 562, memory 564 operatively coupled to at least one of the one or more processors 562, instructions 566 that can be, for example, stored in the memory 564, and one or more interfaces 568. As an example, the system 560 can include one or more processor-readable media that include processor-executable instructions executable by at least one of the one or more processors 562 to cause the system 560 to control one or more aspects of equipment of the logging string 540 and/or the logging truck 550. In such an example, the memory 564 can be or include the one or more processor-readable media where the processor-executable instructions can be or include instructions. As an example, a processor-readable medium can be a computer-readable storage medium that is not a signal and that is not a carrier wave.

FIG. 5 also shows a battery 570 that may be operatively coupled to the system 560, for example, to power the system 560. As an example, the battery 570 may be a back-up battery that operates when another power supply is unavailable for powering the system 560 (e.g., via a generator of the wirelines truck 550, a separate generator, a power line, etc.). As an example, the battery 570 may be operatively coupled to a network, which may be a cloud network. As an example, the battery 570 can include smart battery circuitry and may be operatively coupled to one or more pieces of equipment via a SMBus or other type of bus.

As an example, the system 560 can be operatively coupled to a client layer 580. In the example of FIG. 5, the client layer 580 can include features that allow for access and interactions via one or more private networks 582, one or more mobile platforms and/or mobile networks 584 and via the "cloud" 586, which may be considered to include distributed equipment that forms a network such as a network of networks. As an example, the system 560 can include circuitry to establish a plurality of connections (e.g., sessions). As an example, connections may be via one or more types of networks. As an example, connections may be client-server types of connections where the system 560 operates as a server in a client-server architecture. For example, clients may log-in to the system 560 where multiple clients may be handled, optionally simultaneously.

As an example, the logging string 540 can include one or more NMR units, which may be part of one or more tools that are movable via movement of the logging string 540.

As an example, a combinable magnetic resonance (CMR) tool can be utilized for NMR logging. As an example, NMR measurements can be utilized for determining one or more of reservoir permeability, water cut, and hydrocarbon pore volume. As an example, NMR measurements may be utilized to evaluate porosity and permeability independent of mineralogy. As an example, NMR measurements may be suitable for characterizing thinly laminated reservoirs; low-contrast, low-resistivity pay zones; and carbonates.

As an example, a tool can include circuitry for implementing an enhanced-precision mode (EPM) pulse acquisition scheme to refine precision of NMR data associated with the smallest pores and heavy crude oils. As an example, processing of EPM acquisition data can provide total porosity along with partitioning into micro-, meso-, and macroporosity and estimates of the bound and free fluid. As an example, in complex lithologies, such information can facilitate determining the irreducibile water saturation and potential for water production.

As an example, a tool can include magnets such as permanent magnets that may extend above and/or below an antenna, which may be utilized for delivery of an oscillating magnetic field and/or receipt of responses from nuclei to a delivered oscillating magnetic field. As an example, consider a tool that includes magnets arranged above and below (e.g., approximately 12 cm above and approximately 12 cm below) an antenna (e.g., approximately 2.5 cm). Such an arrangement of components can be utilized to create a longer pre-polarizing field that can provide for increased logging speed (e.g., consider logging speeds to 1,200 meters per hour or more in a fast-relaxation environment).

As an example, an acquisition scheme can be implemented that provides for increased logging speed, increased vertical resolution and/or an arrangement of components (e.g., magnet(s) and antenna(s)) that may be beneficial to one or more logging operations. As an example, where total acquisition time of an acquisition scheme can be reduced, the length of a NMR unit may be reduced, which may reduce mass and demands of movement of a logging string (e.g., consider lesser energy for rotation of a reel, etc.).

Figure 6:
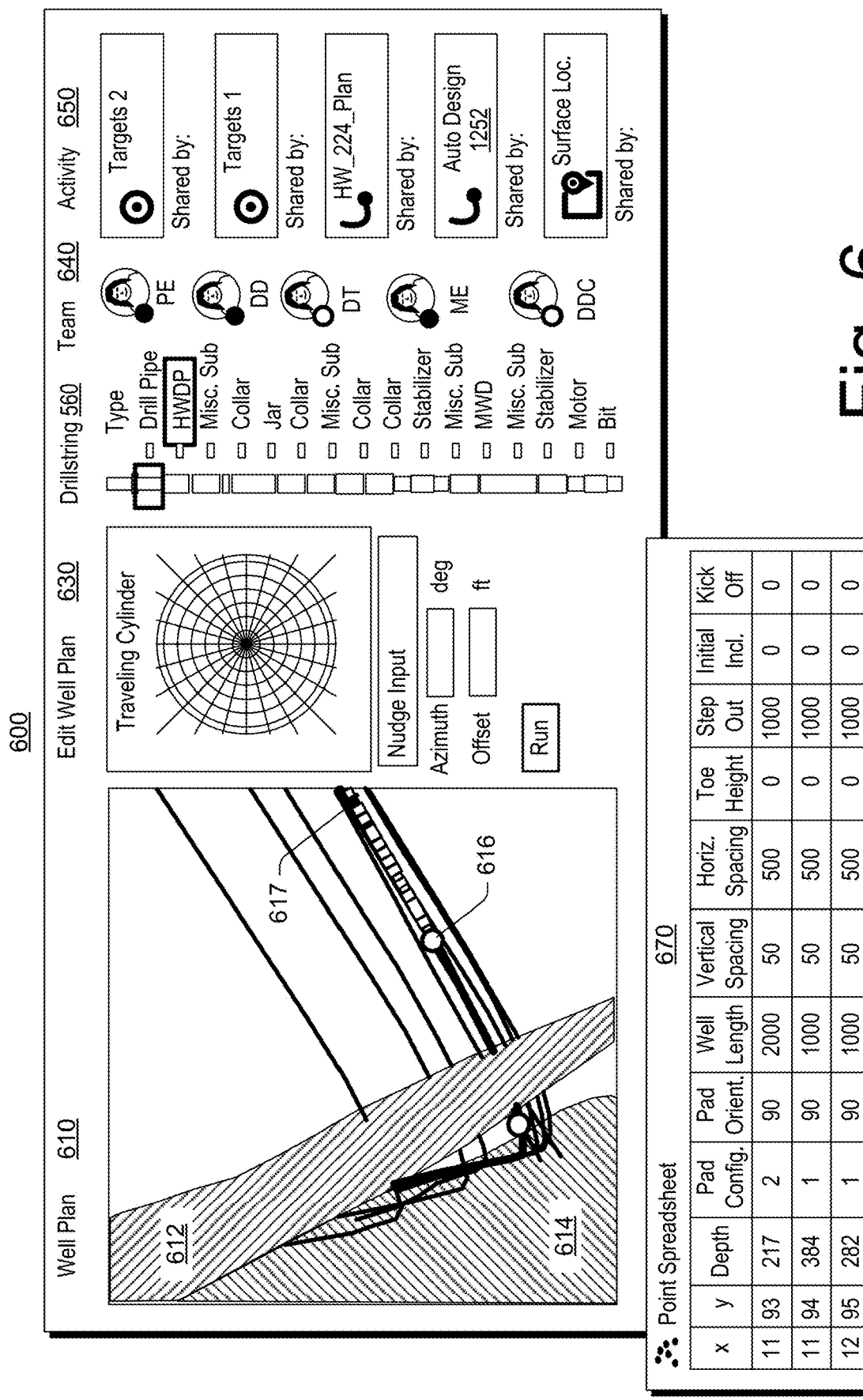
FIG. 6 illustrates an example of a graphical user interface.

FIG. 6 shows an example of a graphical user interface (GUI) 600 that includes information associated with a well plan. Specifically, the GUI 600 includes a panel 610 where surfaces representations 612 and 614 are rendered along with well trajectories where a location 616 can represent a position of a drillstring 617 along a well trajectory. The GUI 600 may include one or more editing features such as an edit well plan set of features 630. The GUI 600 may include information as to individuals of a team 640 that are involved, have been involved and/or are to be involved with one or more operations. The GUI 600 may include information as to one or more activities 650. As shown in the example of FIG. 6, the GUI 600 can include a graphical control of a drillstring 660 where, for example, various portions of the drillstring 660 may be selected to expose one or more associated parameters (e.g., type of equipment, equipment specifications, operational history, etc.). FIG. 6 also shows a table 670 as a point spreadsheet that specifies information for a plurality of wells. For example, the point spreadsheet can include coordinates, dimensions, etc., that specify a trajectory of a well, spacing of wells, etc.

As an example, the drillstring 617 can include one or more NMR units, which can be part of a tool or tools. In such an example, information derived from NMR measurements may be utilized in control of an operation, planning of an operation, etc.

As an example, a tool can include one or more nuclear magnetic resonant (NMR) units. As an example, a tool can be a combinable nuclear magnetic resonance tool, which may be referred to as a CMR tool.

NMR involves a phenomenon by which a nucleus absorbs electromagnetic radiation of a specific frequency in the presence of a strong magnetic field. A NMR technique can include exposing nuclei to a strong static magnetic field and perturbing them by a weak oscillating magnetic field to produce an electromagnetic signal with a frequency characteristic of the magnetic field at the nucleus. The process occurs near resonance, when the oscillation frequency matches the intrinsic frequency of the nuclei, which depends on the strength of the static magnetic field, the chemical environment, and the magnetic properties of the isotope involved.

As an example, a static magnetic field can be specified in units of tesla. A laboratory NMR unit may include a superconducting magnet that can produce a static magnetic field of the order of 20 tesla or more. In logging operations, a logging tool may include a magnet or magnets that can be permanent rather than superconducting or may be non-superconducting electromagnets rather than superconducting where a field of the order of one tesla or less may be generated. As an example, a logging operation may utilize the Earth's magnetic field, which may be assumed to be static along a borehole and of the order of tens of microtesla (e.g., 20 microtesla or 0.2 gauss to 80 microtesla or 0.8 gauss). As mentioned, the frequency at which a nucleus "absorbs" energy depends on the strength of the static magnetic field and is referred to as the Larmor frequency or precessional frequency.

The precessional frequency of nuclei of a substance exposed to a static magnetic field $B_0$ can be determined using the Larmor Equation:

$$\omega = \gamma B$$

where $\omega$ is the Larmor frequency in MHz, $\gamma$ is the gyromagnetic ratio in MHz/tesla and B is the strength of the static magnetic field in tesla. As to $H^1$, consider a precessional frequency of 42.58 MHz for a static field of one tesla (T). In such an example, if the static field is 0.1 T, then the precessional frequency is 4.258 MHz; whereas, for a static field of 10 T, the precessional frequency would be 425.8 MHz.

A NMR unit can investigate a sample (e.g., a rock volume) that is outside the unit while moving the unit along a borehole. Such a NMR unit can include components to generate a static magnetic field and an oscillating magnetic field. In such an arrangement, the fields can be of respective strengths sufficient to penetrate at least approximately 1 cm or more into formation surrounding a borehole. The diameter of a borehole can limit the size of permanent magnets that can be used and, correspondingly, strength of a magnetic field that can be generated by a downhole tool.

As an example, a NMR unit may operate at or below several megahertz and generate a relatively weak (<1 T) and somewhat inhomogeneous magnetic field (e.g., gradients up to 20 gauss/cm). Where the Earth's magnetic field is utilized, an operating frequency may be of the order of approximately several kilohertz; noting that homogeneity may be greater than that of a NMR unit with its own magnet or magnets. Such constraints generally make downhole NMR units more suitable for relaxation investigations; rather than chemical spectroscopy. Downhole NMR units can be operated using various techniques to account for noise, for example, acquiring a sufficient number of echoes and/or stack data to improve signal to noise ratio (S/N).

As an example, a NMR unit can utilize one or more permanent magnets rather than electromagnets to reduce surface-power requirement; can focus a sensitive region of the magnetic field at some distance into the formation, which can help to address mud (e.g., drilling fluid invasion); can use an RF pulse from a coil tuned to the Larmor frequency to help ensure that those nuclei in the sensitive region are in resonance; can control pulse duration, which may help to reduce dead times to allow for a better estimate of initial decay amplitude (e.g., as to porosity) measurement for short T2 components (e.g., bound-fluid evaluation); and can provide for one or more types of pulse sequences, which may be for one or more purposes (e.g., measurement of additional rock, fluid properties, etc.).

As an example, a NMR unit can include features for handling gradients in a static magnetic field, which may causes molecular diffusion. For example, strength of a magnetic field gradient, G, may be controlled by tool design and configuration (e.g., tool size and tool frequency); by environmental conditions such as formation temperature; and by internal gradients induced by an applied field, $B_0$. As an example, characterization of gradients may enable in-gradient diffusion to be used for hydrocarbon typing.

As an example, a NMR unit may be part of a tool that aims to centralize or eccentralize the NMR unit (e.g., with respect to fields and formation). As an example, a tool can include one or more features that can act to position a NMR unit or a portion thereof with respect to a formation (e.g., wall of a borehole). For example, consider a mandrel type of tool or a pad type of tool.

The type of features can be a factor as to length of a NMR unit, which can affect so-called "vertical resolution". Vertical resolution refers to resolution of the NMR unit along a longitudinal axis of a tool, which is generally parallel to the longitudinal axis of a borehole. For deviated wells, including horizontal wells, the so-called "vertical resolution" is not a resolution that is aligned with the acceleration of gravity; rather, it can be at an angle thereto. As utilized herein, "vertical resolution" refers to resolution along a dimension that is substantially parallel to the longitudinal axis of a borehole in which a NMR unit is positioned.

As an example, a contact NMR unit, which may be a CMR type of NMR unit that is utilized in an eccentric manner, can include magnets and electronics that may provide higher vertical resolution that a centralized, non-contact NMR unit; however, possibly with a shallower depth of investigation (DOI) and greater sensitivity to borehole rugosity. As an example, a NMR unit can include, additional to standard permanent magnets, "pre-polarization" magnets, which may be added to help ensure fuller polarization at a desired logging speed.

As an example, a NMR unit or units may operate at several different RF frequencies, optionally simultaneously, to measure multiple sample volumes. In the presence of a gradient magnetic field, pulses with different frequencies can cause protons in different (and parallel) regions of space (e.g., measurement or sensitive volumes) to resonate. Cycling through several frequencies excites protons in different cylindrical volumes, allowing measurements to be made more quickly. If the frequencies of multi-frequency measurements are relatively close together, then the sensitive volumes tend to be relatively close together; and, for practical purposes, the rocks sampled can be considered to be the same (e.g., akin to slice selection in medical MRI imaging).

As an example, a NMR unit may include features to acquire multiple echo trains using different values of wait time (TW), echo time (TE), and variable magnetic gradients (G) in a single logging pass. The time between measurements made at multiple frequencies can be as little as the time of an echo train, and the time between measurements made at a single frequency can be approximately the time to repolarize (e.g., a TW). In a multi-frequency arrangement, thickness of sensitive volumes may be as small as approximately 1 mm.

As an example, a NMR unit can provide for T1 acquisition, T2 acquisition or T1 and T2 acquisition. As mentioned, multi-frequency operation may provide for measurements at multiple DOIs (e.g., approximately 1 cm to approximately 10 cm), which may allow for invasion effects to be accounted for in data interpretation to provide for determination of near-wellbore fluid saturation and oil properties at higher resolution.

A NMR technique can include various sequential actions such as, for example, alignment (polarization) of magnetic nuclear spins in a static magnetic field $B_0$; perturbation of the alignment of the nuclear spins by a weak oscillating magnetic field (e.g., via an RF pulse); and detection of the NMR signal during or after the RF pulse, due to the voltage induced in a detection coil by precession of the nuclear spins around $B_0$. After an RF pulse, precession tends to occur at a nuclei's intrinsic Larmor frequency and, in itself, does not involve transitions between spin states or energy levels. In acquiring NMR measurements, the static and oscillating magnetic fields can be chosen to be perpendicular to each other, which can help to maximize NMR signal strength. For example, $B_1$ can be described in a classical sense as being perpendicular to $B_0$.

As an example, a NMR unit can be part of a tool such as the CMR tool (Schlumberger Limited, Houston, Tex.). The CMR tool can utilize a particular technique referred to as a phase alternating pairs (PAPs) technique to achieve one or more dynamic vertical resolutions, for example, in a high-resolution mode, a standard resolution mode or a fast mode. For example, consider the following vertical resolutions that include static and dynamic: static with 6-in (e.g., 15.24 cm) measurement aperture; dynamic (high-resolution mode) with 9-in (e.g., 22.86 cm), three-level averaging; dynamic (standard mode) with 18-in (e.g., 45.72-cm) vertical resolution, three-level averaging; and dynamic (fast mode) with 30-in (e.g., 76.20-cm) vertical resolution, three-level averaging.

An example of the PAPs technique is described in U.S. Pat. No. 5,023,551 to Kleinberg et al., issued 11 Jun. 1991, which is incorporated by reference herein. The PAPs technique can be utilized for measuring an indication of an attribute of a volume of a formation with a borehole tool that produces a static magnetic field in the volume of the formation, that produces an oscillating magnetic field in the volume of the formation and that measures an induced magnetic signal where the PAPs technique can include (i) producing a static magnetic field in the volume of the formation; (ii) producing oscillating magnetic fields according to a pulse sequence $[W_i-180-\tau_i-90-(t_{cp}-180-t_{cp}-echo_j)_i]$, where j=1, 2, ... J, and J is the number of echoes collected in a single Carr-Purcell-Meiboom-Gill (CPMG) sequence, where i=1, ... l, and l is the number of waiting times used in the pulse sequence, where $W_i$ are waiting times before a CPMG sequence, where are recovery times are recovery times before a CPMG sequence, and $t_{cp}$ is the Carr-Purcell (cp) spacing to induce signals in the volume of the formation (e.g., as to be measured).

Figure 7:
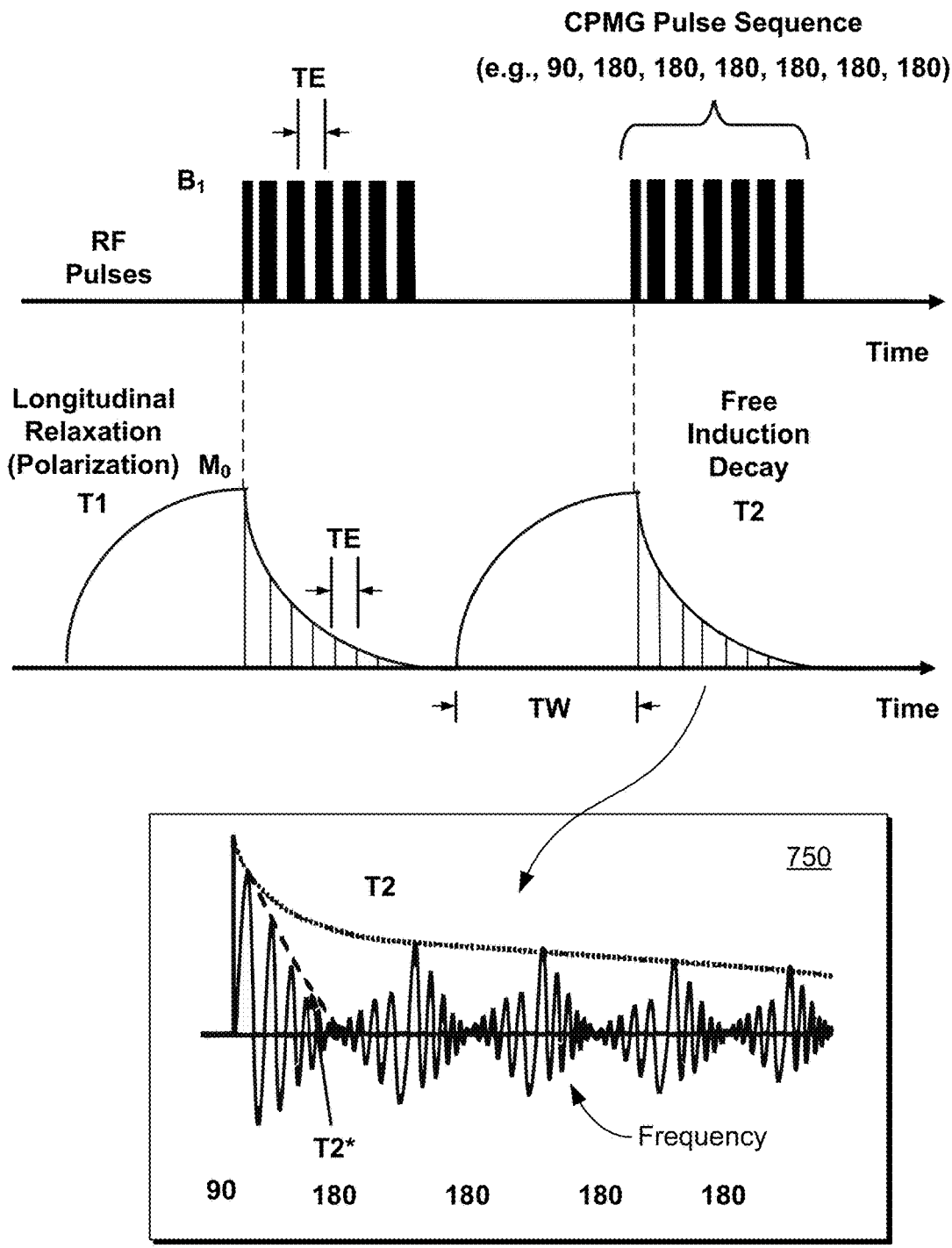
FIG. 7 illustrates an example of a method.

FIG. 7 shows an example of a method 700 that includes emitting RF pulses for an oscillating field $B_1$ to affect nuclei exposed to a static magnetic field $B_0$. In the method 700, two CPMG pulse sequences are illustrated, which include a 90 degree pulse and a train of 180 degree pulses.

The CPMG pulse sequence or simply "CPMG sequence" uses a train of π pulses (π=180 degrees) to refocus inhomogeneous broadening of nuclear spins, which can help to enhance S/N, measure diffusion, measure T2 processes (free induction decay), and reduce experimental time.

Like the Hahn echo, a π pulse is placed after a π/2 pulse (90 degrees) in the NMR experiment, which refocuses the spins leading to echo formation. For CPMG echo train acquisition, n π pulses are applied each 2ntr (if the sample is spinning), resulting in n echoes. The number of echoes which can be acquired is directly related to T2 processes. Neglecting pulse imperfections, the echo tops as shown in a plot 750 of FIG. 7 will diminish in intensity due to coherence losses between spins, which is homogenous T2, as the π pulses refocus the inhomogeneous T2 due to the varying magnetic field experienced by the sample.

As shown in FIG. 7, a maximum amplitude is indicated as Mo, which is a result of a wait time (TW) for longitudinal relaxation (polarization). In the CPMG sequences shown, the first pulse is 90 degrees, which can be thought of as tipping or rotating aligned nuclei into a plane. Once in the plane, some nuclei will lag and some nuclei will advance. Each of the 180 degree pulses acts to "flip" the lagging nuclei and advancing nuclei, which, in time, will cause a re-focusing of the nuclei, as indicated by the successive, yet decaying, amplitude peaks in the plot 750. Where pulse energy and frequency are constant, a 180 degree pulse can be approximately double the duration of a 90 degree pulse, which is approximated by the thickness of the individual pulses in the method 700 of FIG. 7. The echo time (TE) is shown to be the time between 180 degree pulses or, for example, the time between amplitude peaks.

FIG. 8 shows an example of a method 800 with respect to a NMR unit and a sensed region where the method 800 includes exposing the sensed region to a static magnetic field of the permanent magnet (or magnets), utilizing an antenna (e.g., or other transmitter) to generate an oscillating field that penetrates the sensed region, and utilizing the antenna (e.g., as a receiver) to receive energy released by nuclei in the sensed region. As shown, one or more components can be eccentric such that the NMR unit can have an orientation with respect to the sensed region, which can be a portion of a wall of a borehole.

FIG. 8 also shows an example of a tool 850, which can include one or more features such as a stabilizer, a pad, etc. The tool 850 includes an NMR unit 870, for which an approximate cross-sectional view along a line A-A is shown. In the cross-sectional view, the NMR unit 870 is shown to include magnets 872, an antenna 874 and circuitry 880, which can include radio frequency emission circuitry, antenna circuitry and analog-to-digital conversion circuitry (e.g., an analog-to-digital converter (ADC)). As an example, the NMR unit 870 can include one or more passages for one or more conduits. For example, consider a power conduit, a data transmission conduit, a power and data conduit, etc. As an example, the tool 850 can include a power source or be operatively coupled to a power source, which maybe a surface power source (see, e.g., the logging truck 550, the battery 570, etc.). As an example, a power source may be a power grid, a generator (e.g., gas, wind, fuel, etc.), a solar panel, a battery, etc.

As to the circuitry 880, it can include one or more processors and memory accessible to at least one of the one or more processors. For example, the circuitry 880 can include a processor that executes instructions that control energy emissions to generate an oscillating magnetic field, as may be according to a programmed pulse sequence. As an example, the circuitry 880 can include one or more switches, which may be operatively coupled to sources of energy, which can include a source to generate pulsed emissions and/or a source that is an antenna or antennas that receive signals from nuclei in a formation. For example, a switch may act to control an antenna to use the antenna for transmission of energy and then to use the antenna for reception of energy. Received energy can be directed to an analog-to-digital converter that can convert analog signals to digital data according to a selected sampling rate and/or bit depth. As an example, the digital data can be stored to memory and optionally processed by the processor (e.g., downhole) and/or transmitted to another processor, storage device, etc., which may be uphole or part of the downhole tool or another downhole tool. As an example, a processor or processors can be configured using executable instructions to perform one or more operations on data such as, for example, inversion to derive one or more values (e.g., T2 values, T1 values, etc.).

As shown in the example of FIG. 8, the circuitry 880 can include a sequencer 882, a transmitter 884, a receiver 886, and an ADC 888. The sequencer 882 can include instructions or otherwise be instructed to control the transmitter 884, which can be operatively coupled to the antenna 874 for transmission of oscillating magnetic fields. The receiver 886 can be operatively coupled to the antenna 874 for reception of echo signals where such signals can be in analog form and converted into digital echo data using the ADC 888. As shown in the example of FIG. 8, other circuitry 889 can be included, which may be operatively coupled to one or more data and/or power lines. For example, consider one or more data and/or power lines operatively coupled to an uphole (e.g., surface) unit or system. As an example, the sequencer 882 may be programmable via instructions, commands, etc., received from memory locally, from a surface unit or system, another component of a downhole string, etc. As an example, a method can include controlling emissions, which may be via radio frequency emission circuitry. As an example, such circuitry can include the sequencer 882 and the transmitter 884 as operatively coupled to the antenna 874. As an example, a method can include acquiring digital echo data, which may be via antenna circuitry and analog-to-digital conversion circuitry. As an example, such circuitry can include the antenna 874, the receiver 886 and the ADC 888. As an example, compression circuitry may be included to compress digital echo data (e.g., consider one or more of window summing, singular value decomposition, etc.). Data compression may reduce data density for transmission of data uphole to a surface unit or system (e.g., via the circuitry 889, etc.).

As an example, the tool 850 can be dimensioned for receipt in a borehole with a diameter of approximately 10 cm or more, which may depend on features such as a centralizer, pads, etc. As an example, the tool 850 can be of a maximum diameter of a tool body of approximately 5 cm or more. For example, consider an outer tool body diameter of approximately 12 cm at a NMR unit (e.g., a NMR unit with a 12 cm cross-sectional dimension).

As an example, a NMR unit can be skid-mounted to cut through mud cake and for contact with a formation. As an example, contact may be enhanced through one or more components such as an eccentralizing arm or power calipers. As mentioned, internal permanent magnets can be utilized to provide a static polarizing magnetic field. As an example, a NMR unit may be sensitive to a volume of about 1 cm to 3 cm or more into a formation where the volume may extend a length of an antenna along a longitudinal axis of the NMR unit (e.g., 5 cm to 15 cm or more), which can be a factor in vertical resolution. As an example, an antenna can be operated as a transmitter, a receiver or both a transmitter and a receiver. As a transmitter, an antenna can transmit a sequence for an oscillating magnetic field (e.g., consider a CPMG pulse sequence, etc.). As a receiver, an antenna can receive pulse echoes from a formation, including substances in the formation such as one or more fluids.

Figure 9:
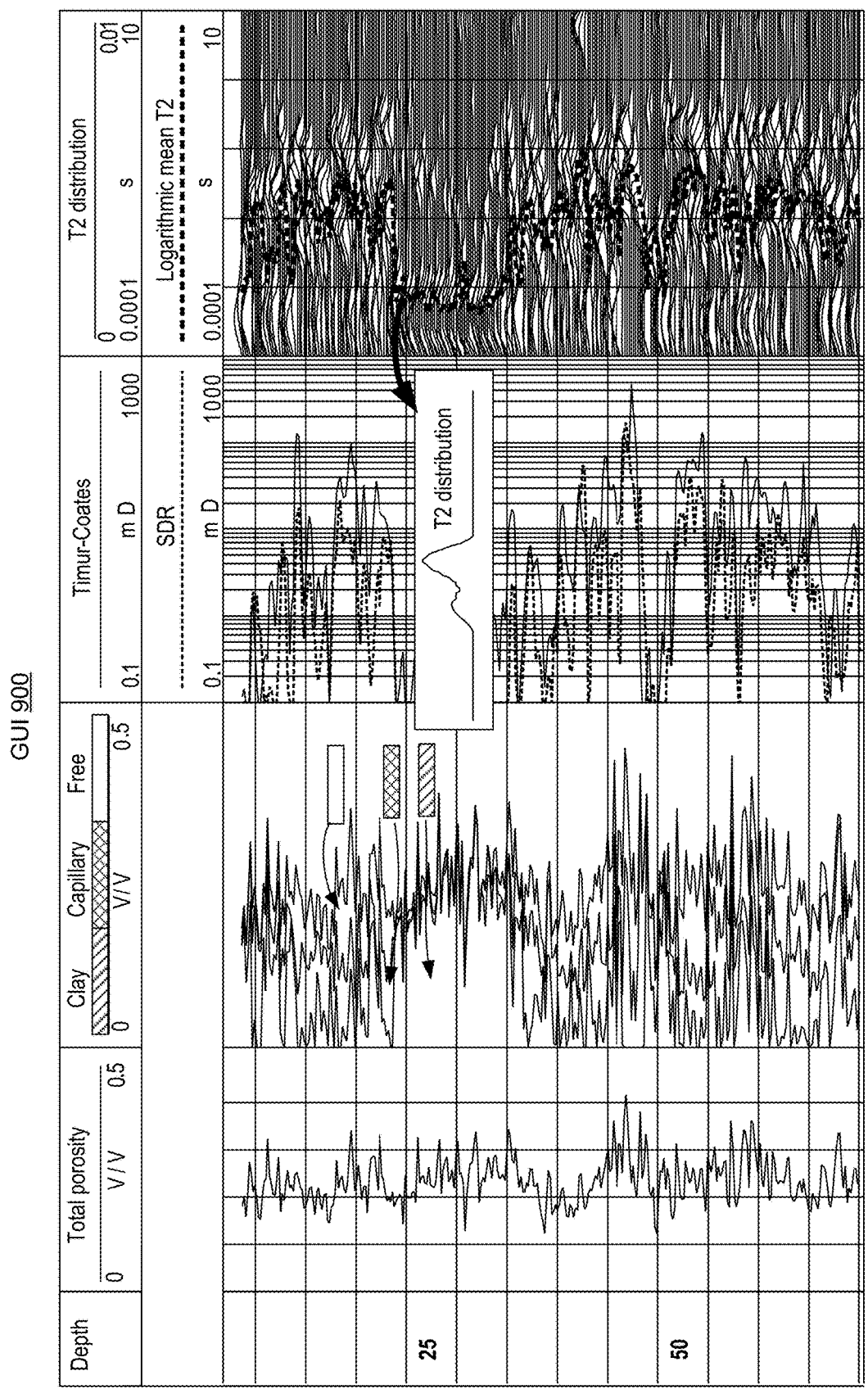
FIG. 9 illustrates an example of a graphical user interface.

FIG. 9 shows an example of a graphical user interface (GUI) 900 that includes graphics derived from NMR data as acquired by a NMR unit of a downhole tool. The GUI 900 shows four tracks in log form, with respect to depth and various other scales. The GUI 900 may include, for example, a gamma ray track, which may help to provide indication of position (e.g., depth, measured depth, etc.). As shown, the first track includes a plot of total porosity (e.g., lithology-independent), the second track includes graphics of volumes of clay-bound water, capillary-bound water, and free fluid derived from a measured T2 distribution, the third track includes permeability estimate graphics as derived using Timur-Coates and Schlumberger-Doll-Research (SDR) permeability equations and the fourth track includes the measured T2 distribution as well as the logarithmic mean T2 values at various depths.

As to depth, indicators as to 25 and 50 are shown, which can be utilized to determine a resolution (e.g., a vertical resolution, which may be with respect to a direction in vertical depth or a direction in measured depth). As may be appreciated, a higher vertical resolution can provide greater insight into characteristics of a formation.

As an example, a tool for NMR can include multiple sensors, including a large antenna for fluid characterization and complementary small aperture antennae for high-resolution acquisition modes. As an example, a tool for NMR can include sensors that can be operated either separately or simultaneously at various logging speeds. For example, consider a tool that can operate at logging speeds up to 1,000 meters per hour or more. As an example, a tool for NMR can provide for analyses of responses for high-resolution identification of long T1 fluids such as light hydrocarbons.

As to logging speed, consider the logging truck 550 of FIG. 5 as including a reel (e.g., a wireline reel, coiled tubing reel, etc.) that can be rotated by a motor to cause the logging string 540 to translate in the openhole section 528, which can be directional such as toward the end of the borehole (inwardly) or toward the surface of the borehole (outwardly). Such directional movement may be referred to as tripping in or tripping out. The logging speed can depend on the type of sequence utilized for NMR. For example, a sequence that takes more time can result in slower logging speeds while a sequence that takes lesser time may result in faster logging speeds (e.g., depending on physical constraints of a system, an environment, etc.). In the example of FIG. 5, the logging truck 550 can include the system 560 where the system 560 controls a reel that controls movement of the logging string 540. For example, rotation of the reel can be controlled to achieve a desired logging speed of the logging string 540. As an example, logging may occur with continuous motion or with starts and stops. As an example, a logging speed may be an average speed that includes time(s) associated with one or more stop/start cycles.

Referring again to the GUI 900 and the fourth track, T2 distributions are illustrated graphically for a series of depths. The GUI 900 shows a single T2 distribution amplified to demonstrate that T2 values can have a peak or peaks for a volume of investigation at a particular depth. As an example, a higher vertical resolution can provide for more T2 distributions over a particular segment of a borehole. As an example, a sequence that can be executed in lesser time with acceptable data quality can provide for a greater logging speed, which may allow for receiving data for a segment of a borehole in a shorter period of time (e.g., more rapid formation evaluation, etc.).

As an example, a method can include various parameters such as a speed parameter, a number of NMR measurements at different depths per unit time parameter, a sequence duration parameter, a maximum speed parameter as to NMR measurements, a maximum speed parameter as to physical constraints on a logging tool and/or a logging system, a maximum data rate or bit rate for transmission of data from a downhole tool, a maximum processing rate as to processing of data (e.g., downhole and/or uphole), etc.

Figure 10:
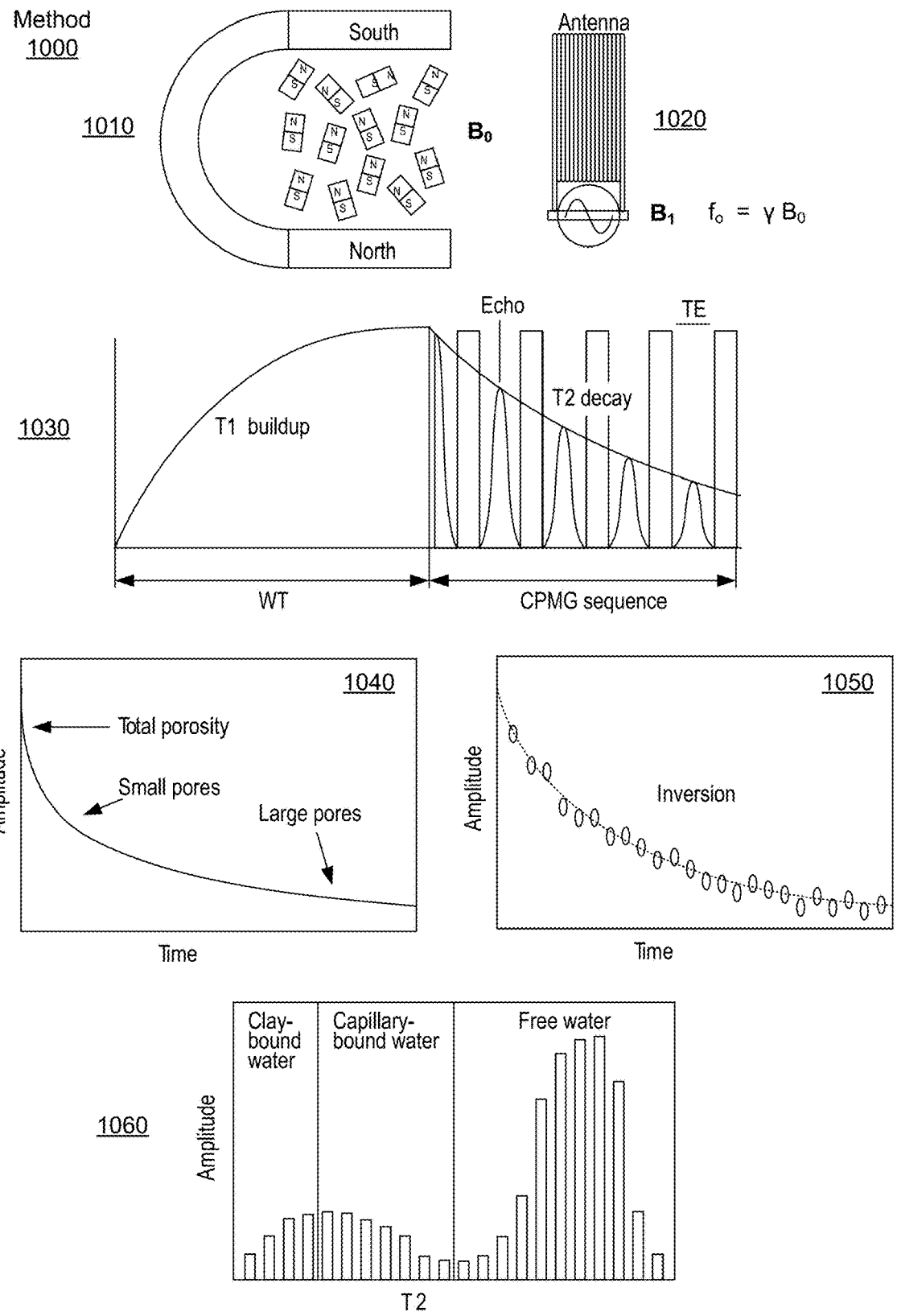
FIG. 10 illustrates an example of a method.

FIG. 10 shows an example of a method 1000 that includes various actions along with approximate graphical representations. The method 1000 includes an exposure block 1010 for exposing nuclei to a static magnetic field, an exposure block 1020 for exposing the nuclei to an oscillating magnetic field, a sequence block 1030 for performing the exposing according to a pre-determined sequence that includes data acquisition, an analysis block 1040 for analyzing at least a portion of acquired data, an inversion block 1050 for inverting at least a portion of the acquired data converts a decay curve into a distribution of T2 measurements and an analysis block 1060 for analyzing a distribution of T2 measurements with respect to porosity (e.g., pore sizes in the formation investigated).

As explained, hydrogen nuclei behave like tiny bar magnets and tend to align with the magnetic field of permanent magnets, such as those in an NMR logging tool. During a set wait time (WT), the nuclei polarize at an exponential buildup rate, T1, including multiple components (C). Next, a train of RF pulses can adjust spins of the hydrogen nuclei causing them to tip 90 degrees and then precess about the permanent magnetic field, as mentioned, 180 degree pulses can re-focus the hydrogen nuclei at particular times. The formation fluids can generate RF echoes responsive to successive 180 degree pulses where the RF echoes are received and measured by the antenna of the NMR logging tool. The time between the 180 degree pulses can be defined as the echo spacing or echo time (TE). The amplitudes of the echoes decay at a superposition of exponential relaxation times, T2, which tend to be functions of pore-size distribution, fluid properties, formation mineralogy and molecular diffusion. As an example, an inversion technique can be applied that converts a decay curve into a distribution of T2 measurements (see, e.g., T2 distribution of the GUI 900 of FIG. 9). In general, for brine-filled rocks, the distribution is related to the pore sizes in the rocks.

FIG. 11 shows an example of a method 1100 and an example of a system 1190. As shown, the method 1100 can include a control block 1110 for controlling radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; and acquisition block 1120 for acquiring, via antenna circuitry and analog-to-digital conversion circuitry, nuclear magnetic resonance echoes as digital echo data during and responsive to each of the sequences.

As shown in FIG. 11, the method 1100 can include an inversion block 1130 for inverting the digital echo data to determine at least one T1 value using the first wait time, the second wait time and a combination of the digital echo data for the first wait time and the second wait time. As shown, the method 1100 can include a characterizing block 1140 for characterizing a formation using the at least one T1 value.

As mentioned, a method can include inverting for a distribution of T2 values (see, e.g., block 1050 of FIG. 10 and the GUI 900 of FIG. 9). As an example, a method can include inverting for both T1 values and T2 values.

As an example, a first set of parameters and a second set of parameters can include a common echo time (TE). As an example, an acquisition process can acquire a common number of echoes for each sequence where an even number of sequences with phase cycling occurs using a first set of parameters that includes a first wait time and a single sequence with a single phase occurs using a second set of parameters that includes a second wait time that is greater than the first wait time.

As an example, an inversion technique can invert digital echo data to determine at least one T1 value using a combination of a first wait time and a second wait time where, for a common echo time (TE), the inversion technique includes dividing the common echo time (TE) by a T2 variable, dividing the first wait time by a T1 variable and dividing the second wait time by the T1 variable.

As an example, a first set of parameters can correspond to an even number of Carr-Purcell-Meiboom-Gill (CPMG) sequences with phase cycling. As an example, a second set of parameters can correspond to a single Carr-Purcell-Meiboom-Gill (CPMG) sequence without phase cycling (e.g., for a single phase).

As an example, a single phase of a sequence of a second set of parameters can be offset by an opposing phase of one of an even number of sequences of a first set of parameters. In such an example, the offset can help to reduce a DC offset. As an example, a method can include controlling equipment to perform a pseudo-PAPsing method.

The method 1100 of FIG. 11 is shown as including various computer-readable storage medium (CRM) blocks 1111, 1121, 1131, and 1141 that can include processor-executable instructions that can instruct a computing system, which can be a control system, to perform one or more of the actions described with respect to the method 1100.

As shown in the example of FIG. 11, the system 1190 can include one or more computers 1192 that include one or more processors 1193, memory 1194 operatively coupled to at least one of the one or more processors 1193, instructions 1196 that can be, for example, stored in the memory 1194, and one or more interfaces 1195. As an example, the system 1190 can include one or more processor-readable media that include processor-executable instructions executable by at least one of the one or more processors 1193 to cause the system 1190 to perform actions such as, for example, one or more actions of the method 1100. As an example, the instructions 1196 can include instructions of one or more of the CRM blocks 1111, 1121, 1131, and 1141. The memory 1194 can be or include the one or more processor-readable media where the processor-executable instructions can be or include instructions. As an example, a processor-readable medium can be a computer-readable storage medium that is non-transitory that is not a signal and that is not a carrier wave.

As an example, NMR can be performed where ringing exists. Magnetoacoustic ringing effects can give rise to baseline shifts, which can affect accuracy of NMR measurements. Baseline shifts can arise from "phase glitches" and from inhomogeneities in static and RF magnetic fields.

Four contributions can be included in received voltage in an echo window. The first (S) is the signal from the resonated nuclear spins and is the desired signal for detection. The phase of S is determined by the phase of the initial 90 degree pulse in the CPMG sequence. The second contribution (R) is the result of baseline effects generated by the 180 degree pulses which are not influenced by the phase of the 90 degree pulse. Phase glitch and field inhomogeneity effects, and magnetoacoustic ringing from the 180 degree pulses fall in this category. The third contribution (r) is produced by the 90 pulse and is phase coherent with it. Magnetoacoustic ringing from the 90 degree pulse falls into this class. The fourth contribution is an electronic baseline (B), which may vary slowly as a function of time, and whose phase does not depend on the phases of the various pulses. The phase coherence characteristics of the undesired contributions make it possible to electronically cancel them according to the aforementioned PAPs technique (e.g., FIR-CPMG sequence). In such an approach, a subtraction process of results of a second set of experiments from a first set provides a signal of 2S+2r. Subtracting a fourth set of experiments from a third set provides a signal of 2r. Subtracting the 2r from the 2S+2r (e.g., combining the experiments by adding the first and fourth, and subtracting therefrom the second and the third) provides the desired signal free from baseline shifts. It may be appreciated that if the effect of ringing after the 90 degree pulse is negligible, the third and fourth sets of the sequence may be optional. In the aforementioned PAPs technique, a two sequence cycle (positive phase and negative phase) can be adequate to address baseline and 180 degree ringing issues, where inclusion of third set and fourth set may provide for reduction of an initial transient, which tends to decay before echo integration.

As explained, spurious ringing may be addressed using dedicated acquisition sequences and/or by applying specific data processing. Such approaches use dedicated acquisition sequences that rely on the ringing signal during the "estimation" sequence to be unchanged compared with that which contaminates the standard CPMG sequence providing the desired NMR signal. However, such a result is not guaranteed in realistic logging environments. An approach that utilizes data processing techniques tends to depend on the separability of NMR and ringing signals. However, in some cases, ringing and NMR signals may be relatively indistinguishable, including having a similar phase. In such cases the reliability of certain processing techniques may be compromised.

As an example, a method can utilize a first set of parameters for an even number of sequences with phase cycling and a second set of parameters for a single sequence with a single phase. Such a method can combine different sequence measurements (e.g., different CPMG sequences) to reduce ringing while minimizing an overall acquisition time for T1 and T2 measurements. Such a method can optionally be implemented to improve vertical resolution of NMR results (e.g., through minimizing acquisition time).

As mentioned, antenna ringing can be detrimental in NMR logging operations. As an example, a method can utilize sequences that reduce ringing without having each sequence being in a pair of a phase alternated pair (PAP). For example, two sequences can be a PAP and another sequence can be a non-PAP, which can be a single instance of that sequence. Such an approach can reduce total acquisition time, which can provide for an improvement in vertical resolution. As an example, hybrid PAP/non-PAP approach can minimize artifacts due to time varying ringing which may compromise PAPsed data for CPMG measurements with long wait-times.

Certain example embodiments can adapt a PAPsing technique using a non-PAP sequence for T1-T2 saturation recovery schemes. Such an approach can involve combining CPMG trains with different wait times (WTs) and may be referred to as a "pseudo-PAPs" approach. As an example, provided that two CPMGs have the same number of echoes and echo spacing and that their respective excitation pulses (90 degree pulse) have opposite phase (per standard PAPs), the ringing signal can be cancelled. Unlike for PAPs, where the NMR signal amplitude is a function of a single wait time (WT), the NMR signal amplitude in a pseudo-PAPs approach depends on more than one wait time (e.g., two wait times). The mathematical function describing echo amplitude on wait time for both standard and pseudo PAPs can define the NMR kernel used to invert the pseudo-PAPsed data.

Figure 12:
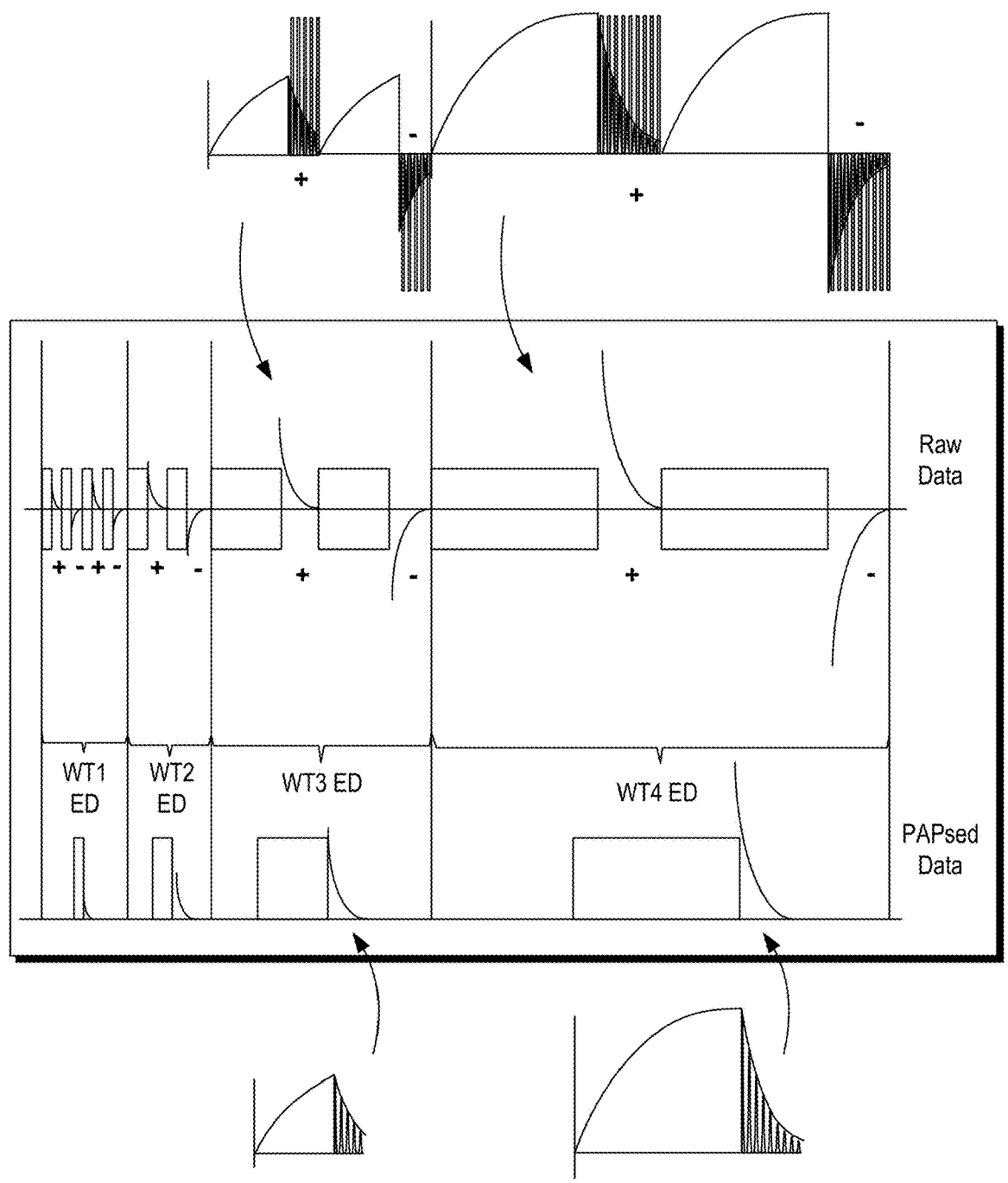
FIG. 12 illustrates an example of a PAPs method.
Figure 13:
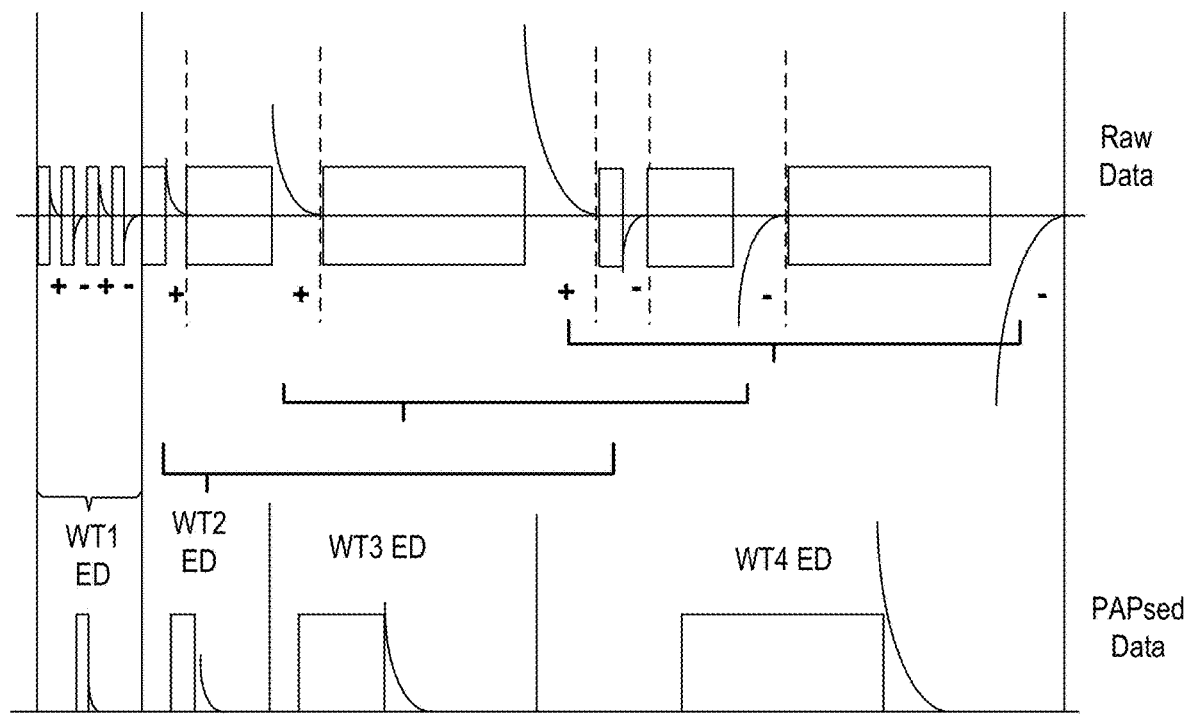
FIG. 13 illustrates an example of a PAPs method.

FIG. 12 shows a method 1200 with approximations of sequences where each wait time WT1, WT2, WT3 and WT4 is for a PAP and where positive and negative phases are indicated where each positive phase and negative phase pair can be referred to as a phase cycle. In FIGS. 12, 13 and 14, "ED" refers to "echo data" as associated with the various wait times (e.g., WT1 ED, WT2 ED, WT3 (−) ED+WT4 (+) ED, etc.). As indicated, where the wait time is longer, the signal amplitude can increase (e.g., consider T1), which can benefit signal to noise ratio (S/N). In the method 1200, WT1 includes two PAPs; whereas, each of WT2, WT3 and WT4 includes a single PAP. At the longest wait time (e.g., WT4), a PAPs approach can utilize a single PAP, which can be a substantial portion of a total acquisition time. For example, consider the PAP for WT4 as being approximately 50 percent of the total acquisition time.

As an example, an approach can utilize a non-PAP longest wait time such that a single instance of the longest wait time occurs. In such an example, the total acquisition time may be trimmed by more than 10 percent (e.g., consider a reduction of the total acquisition time by 15 percent or more). As mentioned, a logging speed may be of the order of 1,000 meters per hour. With a pseudo-PAPs approach, the logging speed and/or vertical resolution may be increased. For example, consider increasing the logging speed to 1,100 meters per hour or more, or, for example, increasing a parameter such as sample per meter (e.g., vertical resolution).

In the method 1200, the sequences in each of the PAPs are sequential. As shown, the + and − phases for each wait time are acquired consecutively.

FIG. 13 shows an example of a method 1300 where a complete set of + phases are acquired for wait times and then a complete set of − phases are acquired for the wait times. For sub-measurements which include more than one PAP, these may be split between the + and − phases or completed in a single "burst" (as shown). The standard PAPs method 1200 and 1300 provide for identical PAPsed data and the total acquisition time is identical for the two.

FIG. 14 shows an example of a method 1400 that is a pseudo-PAPs method that includes wait times WT1, WT2, WT3 and WT4 with associated echo data ED and an example of another method 1450 that is a pseudo-PAPs method that includes wait times WT1, WT2, WT3 and WT4 with associated echo data ED.

As shown in the method 1400, the sequences for WT1 and WT2 correspond to PAPs; whereas, the third and fourth sequences are non-PAPs. Specifically, the third sequence utilizes WT3 and data processing utilizes WT2 and WT3 where one phase of the WT2 PAP sequences (WT2 ED+ or −) is utilized to cancel effects in an opposing phase of the WT3 non-PAP sequence (e.g., WT3 ED as − or +). As to the fourth sequence, it utilizes a phase that is opposite that of the WT3 non-PAP sequence such that data processing utilizes WT3 ED and WT4 ED to cancel effects.

In the example of FIG. 14, the method 1400 includes two non-PAP sequences where, as shown, the two non-PAP sequences have opposing phases (e.g., + and −, or − and +). In the example of FIG. 14, the total acquisition time is reduced by utilizing one instance of the WT3 sequence and one instance of the WT4 sequence. Thus, in comparison to the methods 1200 and 1300, a reduction of more than 20 percent in the total acquisition time may be realized. As mentioned, such a reduction can be utilized to achieve a faster logging speed and/or an increased vertical resolution.

In the example method 1400 of FIG. 14, one of the non-PAP sequences (WT3) is associated with a PAP sequence (negative phase of WT2 ED); whereas, the other non-PAP sequence (WT4) is associated with a non-PAP sequence (WT3 ED). As an example, yet another non-PAP sequence (e.g., WT5) may be utilized with a positive phase and data thereof processed with a non-PAP sequence having a negative phase (e.g., WT4). As an example, a pseudo-PAPs approach can include, in various orders, one or more PAP sequences and one or more non-PAP sequences.

In the example method 1400 of FIG. 14, as explained, the long wait time echo trains (WT3 and WT4) are acquired just once, each with a single phase, but successive echo trains (having different wait times) are acquired with opposite phase and are then combined in "pseudo" PAPs. For reduction of ringing or DC offsets, the combined echo trains can be specified to have the same number of echoes and the same echo spacing. As an example, a desired pseudo-PAPs series can be defined using a pulse sequence editor, which may be part of a NMR unit or tool system.

As to the example method 1450 of FIG. 14, there are four sequence repeats for WT1 ED with alternating phases (e.g., standard PAPs), a string of positive phases for WT2 ED and WT3 ED followed by a string of negative phases for WT2 ED and WT3 ED (e.g., standard PAPs), followed by a single phase for WT4 ED which is shown as negative but could be positive and, for data processing, paired with an opposing one of the phases for WT3 ED (e.g., positive or negative).

For a data acquisition method that involves controlling equipment in a downhole environment to acquire NMR measurements, the number of echoes (NE) can be the same for a non-PAP or the number of echoes (NE) may differ and a common number of echoes (NE) be selected (e.g., accessed, etc.) for data processing. In a pseudo-PAPs approach, a control method can, for data acquisition, specify a common echo time (TE) for a pseudo-PAPs approach such that an inversion process can proceed according to the pseudo-PAPs kernel. An inversion process can include accessing echo data that are for a common number of echoes and/or selected a common number of echoes from echo data that may include more than the common number of echoes.

As explained, data processing for pseudo-PAPs has some dependence on data acquisition, specifically, echo time (TE) being equal where data processing can select/process an equal number of echoes for two different wait times, which have echo data with the same echo time (TE). As an example, if the common TE condition is met for a standard PAP, then the pseudo-PAPs data processing can use less than a full set of standard PAP data. For example, consider using one set of echoes from the longest wait time rather than two sets. As such, the pseudo-PAPs data processing is not limited to a pseudo-PAPs data acquisition; rather, a limitation can be with respect to TE (e.g., imposing a common TE on two different wait times where an opposing phase pair can be made, one phase from each of the two different wait times).

As explained, during logging operations (e.g., whether LWD, wireline, etc.), a benefit from pseudo-PAPs approach for data acquisition can be a shorter total acquisition time. The total acquisition time for a pseudo-PAPsed method can be less than that of a standard PAPs schemes (see, e.g., FIGS. 12 and 13). The overall time saving can depend on the length of the longest wait time or times in the sequence. As an example, a difference with pseudo PAPsing can be that the resulting PAPsed data can contain echoes acquired with two different wait times; whereas, in standard PAPsing each PAPsed echo train is associated with a single wait time.

Below, a PAPs inversion kernel is shown:

$$M(n, WT_k) = \sum_{i,j} \left(1 - \exp\left(-\frac{WT_k}{T1_i}\right)\right) \exp\left(-\frac{n \cdot TE_k}{T2_j}\right) \times A(T1_i, T2_j)$$

In the kernel above, the variables are:

| | |
|---|---|
| $M(n, WT_k)$ | Amplitude of the nth echo in the PAPs corresponding to kth sub-measurement with wait time |
| $WT_k$ | Wait time for the kth sub-measurement |
| $TE_k$ | Echo spacing for the kth sub-measurement |
| $T1_i$ | i th T1 component |
| $T2_j$ | j th T2 component |
| $A(T1_i, T2_j)$ | Amplitude of component i, j in T1-T2 distribution |

For pseudo PAPsing, the kernel differs to reflect the addition of measurements with different wait times:

$$M(n, WT_k, WT_l) = \frac{1}{2}\sum_{i,j}\left(2 - \exp\left(-\frac{WT_k}{T1_i}\right) - \exp\left(-\frac{WT_l}{T1_i}\right)\right)\exp\left(-\frac{n \cdot TE_k}{T2_j}\right) \times A(T1_i, T2_j)$$

Above, the different wait times are $WT_k$ and $WT_l$ where TEk can be a common echo time. The amplitude (A) can be a matrix that can include the T1 and T2 values. Note that the pseudo-PAPs kernel obeys the same physics as the PAPs kernel and does not represent additional approximation and will reduce to the PAPs kernel when the wait times for the two trains being combined are identical. Provided that the NMR echo data is processed appropriately (e.g., the pseudo PAPs are formed properly), the inversion can proceed in a manner such as that of PAPs to yields substantially similar results within limits of signal-noise.

FIG. 15 shows a table 1500 with examples of sets of parameters for various segments in an acquisition scheme. The parameters include wait time (WT), echo time (TE), number of echoes (NE) and number of repetitions (NR). The parameters were utilized with a field operation that involved logging while drilling (LWD) where logging was performed using a NMR unit as part of a drilling string. In the example shown, the acquisition scheme included 6 segments or sub-measurements. As shown in the table 1500, the first sub-measurement (WT=6000 ms) has a single "repeat" (NR=1) (e.g., a single sequence). This implies that it cannot form a standard PAP. However, a pseudo-PAP can be formed with the second sub-measurement (WT=1000 ms), which has the same echo time (TE=1.0 ms) and the same number of echoes (NE=1024). The total acquisition time for the acquisition scheme of the table 1500 is 18.3 seconds. Note that if standard PAPsing is used with the same wait times (NR=2 for sub-measurement 1, to form a PAP for WT=6000 ms), the total acquisition time is 25.4 seconds. Thus, the difference is 7.1 seconds such that the pseudo-PAPs approach is approximately 72 percent of the time of the PAPs approach, a greater than 25 percent reduction in total acquisition time.

FIG. 16 shows plots 1610 and 1630 of NMR echo data acquired and processed using the values in the table 1500. The plot 1610 shows the raw unPAPsed echo amplitudes. Note that the first segment (1) has a single echo train, in this case with +ve phase. The pseudo-PAPsed data are shown in the plot 1630. A pseudo-PAP is formed using sub-measurement 1 and the −ve phase train from sub-measurement 2, as indicated in the plot 1630 (see, e.g., "1+2"). A standard PAP is also formed with the +ve and −ve phase trains for sub-measurement 2.

Again, the plot 1610 of FIG. 16 shows raw echo data and the plot 1630 shows pseudo-PAPsed data as acquired using a LWD NMR tool in a logging run. Data plotted are averaged over the entire logging run.

Figure 17:
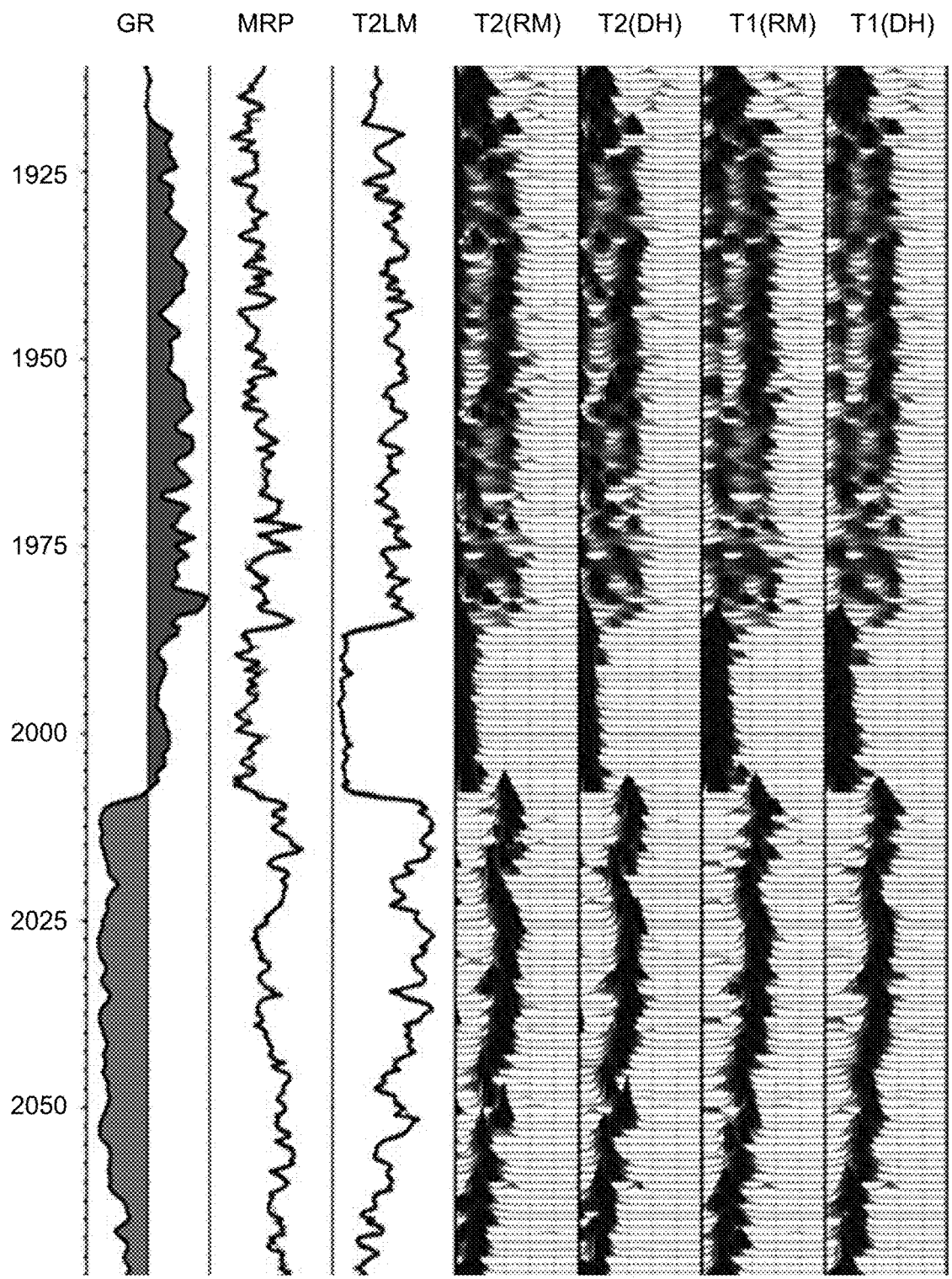
FIG. 17 illustrates an example of a graphical user interface that includes examples of tracks or logs.

FIG. 17 shows various log tracks 1700 including tracks derived from the data acquired according to the acquisition scheme of the table 1500. The acquired data were processed according to the pseudo-PAPs kernel, which accounts for pseudo PAPsing with non-identical wait times. Specifically, the log tracks 1700 include NMR logs from a LWD NMR field operation derived from inversion of the pseudo PAPsed data. The results are for data pre-processed downhole (DH) and uphole (RM, "Recorded Mode"). The tracks include gamma ray (GR), magnetic resonance porosity (e.g., total amplitude), T2 RM, T2 DH, T1 RM and T1 DH.

As an example, a pseudo-PAPs approach can provide an efficient way to reduce ringing and offsets in NMR log data. Such an approach can be beneficial in instances where long wait times are desired or demanded (e.g., as may depend on formation properties, formation fluids, etc.), such as in T1-T2 measurements.

As mentioned, a pseudo-PAPs approach can improve vertical resolution of logs (e.g., due to shorter acquisition time), increase logging speed and/or improve ringing reduction for long wait times (e.g., due to shorter time delay between combined echo trains such that ringing variations are minimized).

Figure 18:
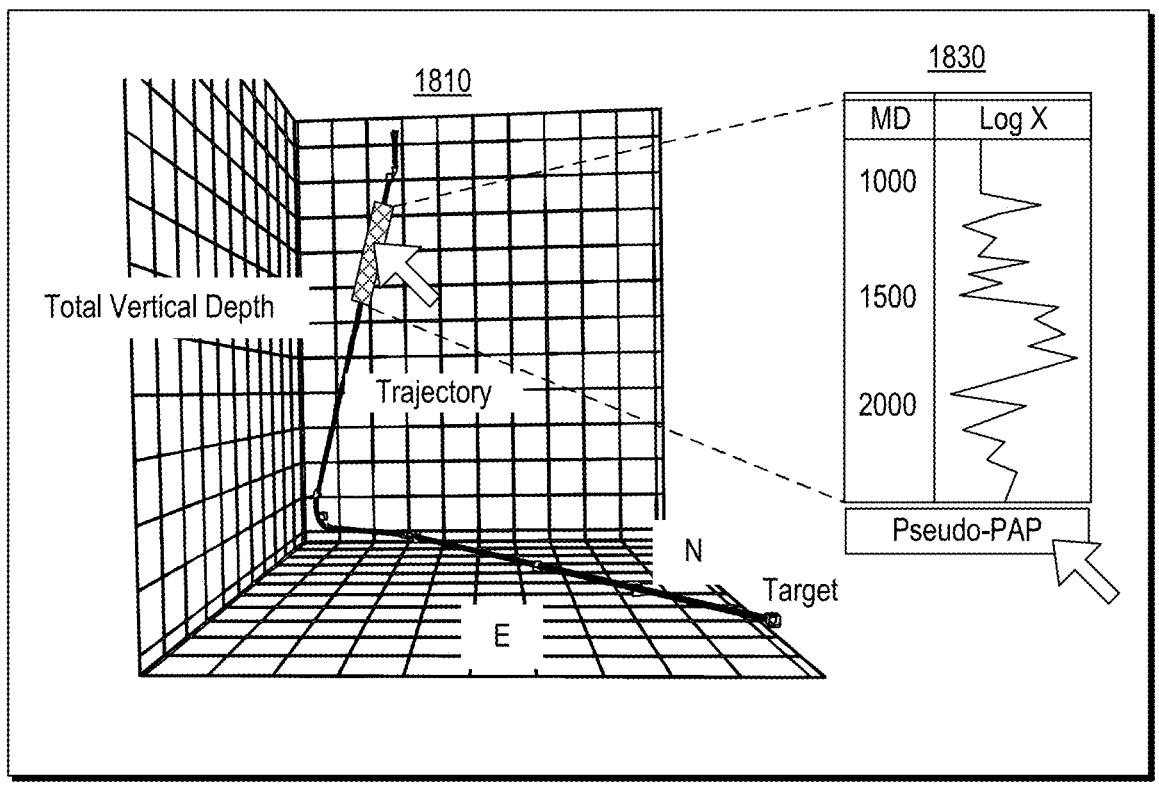
FIG. 18 illustrates an example of a graphical user interface.

FIG. 18 shows an example of a graphical user interface 1800 that includes a visualization rendered by a computational framework where one or more logs may be rendered such as an example log 1830, which can be a NMR log that can be a pseudo-PAPs log. As shown, a user may select a desired portion of a borehole trajectory in a rendering to cause rendering of a corresponding log or logs for that portion of the borehole trajectory. In the example log 1830, the depth is presented as measured depth. For example, if a horizontal portion of the trajectory is selected, the true vertical depth may be approximately constant; whereas, measured depth will vary. For logs of a deviated portion, resolution may be increased and/or logging speed may be increased using a pseudo-PAPs approach. Again, as shown in the example log 1830, a GUI may render an indication that a NMR log (or information derived therefrom) is for an acquisition scheme that utilizes a pseudo-PAPs approach (e.g., PAP sequences and at least one non-PAP sequence). In such an example, a user can be aware of how to process the NMR data if additional processing, re-processing, etc. is desired.

Figure 19:
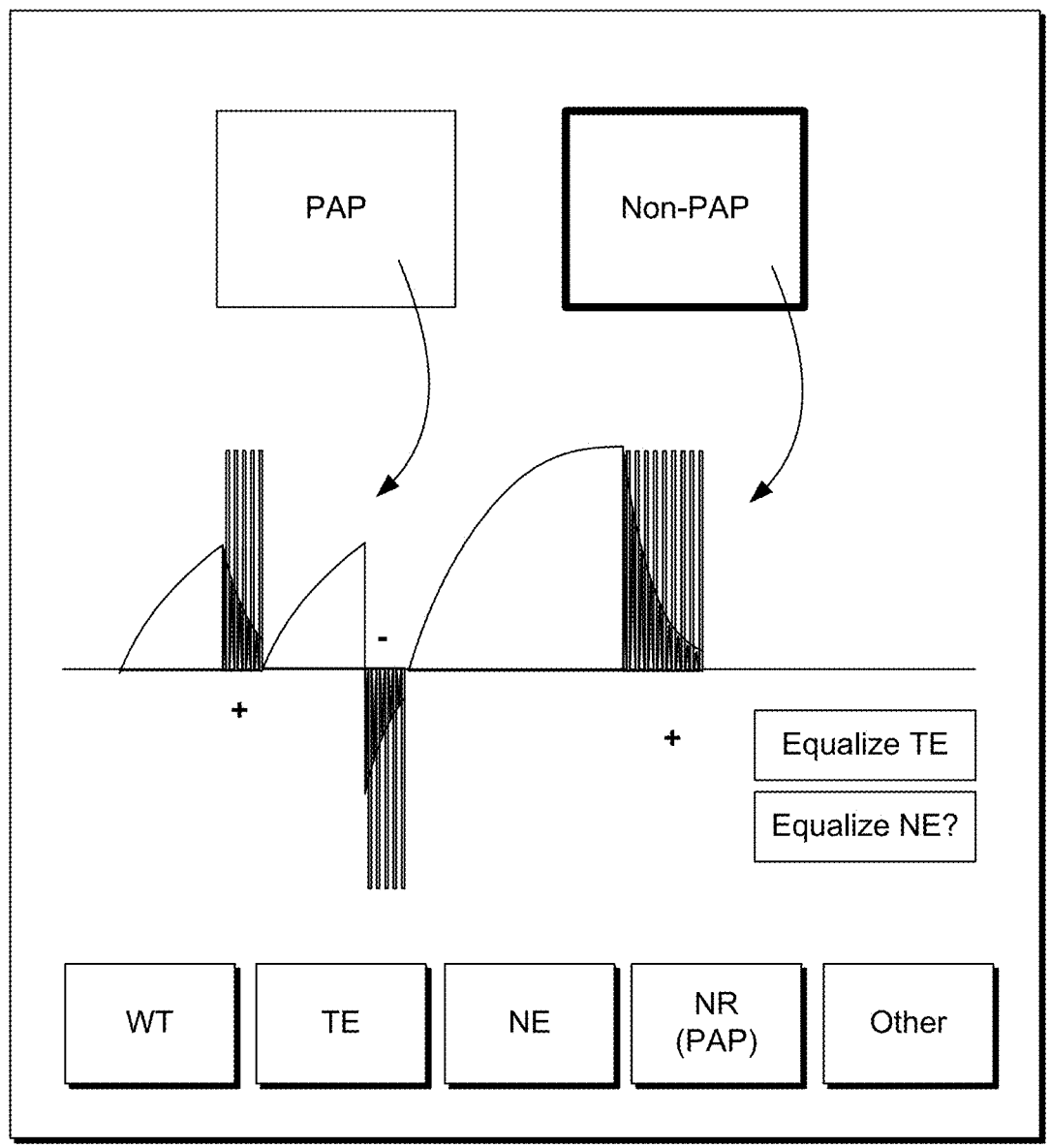
FIG. 19 illustrates an example of a graphical user interface.

FIG. 19 shows an example of a GUI 1900 for building an acquisition scheme. For example, the GUI 1900 can include a PAP graphical control and a non-PAP graphical control for building a pseudo-PAPs acquisition scheme. In such an approach, underlying rules may be implemented to facilitate building a pseudo-PAPs sequence. For example, an underlying rule can identify a phase of a prior sequence such that an inserted pseudo-PAP sequence is of an opposing phase. As shown in the GUI 1900, the non-PAP sequence is positive; whereas, the PAP sequences include positive and negative (e.g., a phase cycle). In such an approach, a rule can identify a prior sequence, as may be acquired using the same antenna, such that an inserted non-PAP sequence provides for two sequences that are of opposing phases (e.g., to reduce ringing, etc.) as part of a pseudo-PAPs acquisition scheme. The GUI 1900 may include graphical controls for one or more parameters such as WT, TE, NE, NR or other. As shown, the repeat number (NR) may be for PAP sequences (e.g., an even value such as NR=2, 4, 8, 16, etc.) and be set to a default value of one (NR=1) for a non-PAP sequence. As to TE, a rule can identify a TE of a prior sequence and utilize that value for a non-PAP sequence such that a common TE is utilized where the two sequences form a pair with opposing phases. As to NE, a rule can identify a NE of a prior sequence and utilize that value for a non-PAP sequence such that a common NE is utilized. As shown, a graphic can indicate "Equalize TE" and/or a graphic can indicate "Equalize NE?", which may be selectable to cause the builder to equalize a number of echoes for two different wait times.

As an example, a sequence editor can include instructions that implement one or more rules for building a pseudo-PAPs acquisition scheme. As an example, such a sequence editor can include various fields, controls, etc., for setting parameter values. Such values may be determined via receipt of user input and/or via application of one or more rules such that one or more values are determined automatically using values from another sequence such as a PAP sequence. As an example, a sequence editor can include generating an estimated total acquisition time, which may be compared to one or more other total acquisition times. For example, consider a pseudo-PAPs time versus a PAPs time where the pseudo-PAPs time may be utilized by a logging system to determine one or more logging parameters (e.g., resolution, logging speed, etc.).

As an example, a method can include controlling radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; and acquiring, via antenna circuitry and analog-to-digital conversion circuitry, nuclear magnetic resonance echoes as digital echo data during and responsive to each of the sequences. In such an example, the first set of parameters and the second set of parameters can include a common echo time. As an example, in the foregoing method, acquiring can acquire a common number of echoes for each of the sequences.

As an example, a method can include inverting digital echo data to determine at least one T1 value using a first wait time, a second wait time and a combination of the digital echo data for the first wait time and the second wait time. In such an example, the first set of parameters and the second set of parameters can include a common echo time, where the inverting uses a common number of echoes of the digital echo data for the first wait time and the second wait time and dividing the common echo time by a T2 variable, dividing the first wait time by a T1 variable and dividing the second wait time by the T1 variable.

As an example, a method can include determining at least one T1 value using digital echo data, determining at least one T2 value using digital echo data and/or determining at least one T1 value and at least one T2 value using digital echo data. As an example, a longest wait time (e.g., a second wait or other wait time of a single phase, etc.) can be greater than approximately 1 second. Such a wait time may account for an expected and/or known T1 or T1s of objects and/or substances.

As an example, a set of parameters can correspond to an even number of Carr-Purcell-Meiboom-Gill (CPMG) sequence repeats and another set of parameters can correspond to a single Carr-Purcell-Meiboom-Gill (CPMG) sequence. In such an example, the sets can be first and second sets or other denoted sets that are part of a pseudo-PAPs acquisition method that includes controlling equipment in a downhole environment to acquire NMR measurements (e.g., digital echo data).

As an example, a single phase of a sequence of a set of parameters can be offset by an opposing phase of one of an even number of sequence repeats of another set of parameters. As an example, a method can provide for reducing DC offset. As an example, a method may be referred to as a pseudo-PAPsing method or a pseudo-PAPs method.

As an example, a method can controlling radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; acquiring, via antenna circuitry and analog-to-digital conversion circuitry, nuclear magnetic resonance echoes as digital echo data during and responsive to each of the sequence; and controlling a logging speed of a downhole tool based on a total acquisition time of an acquisition scheme that includes the sequences. In such an example, the method or a portion thereof, can include controlling the radio frequency emission circuitry of a nuclear magnetic resonance unit to emit radio frequency energy according to a third set of parameters that includes a third wait time for a single sequence with a single phase that is opposite the single phase of the second set of parameters, where the third wait time is greater than the second. In such an example, data processing can include inverting the digital echo data to determine at least one T1 value using the second wait time, the third wait time, and a combination of the second wait time and the third wait time.

As an example, a method can include building an acquisition scheme that includes values for the first set of parameters and the second set of parameters, where the building includes applying at least one rule that sets a value of one of the second set of parameters using a value of one of the first set of parameters.

As an example, a method can include rendering a visualization to a display of distribution of T2 derived from digital echo data that corresponds to a depth of a logging tool in a borehole in a formation.

As an example, a system can include a processor; memory accessible to the processor; processor-executable instructions stored in the memory and executable by the processor to instruct the system to: control radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; and acquire, via antenna circuitry and analog-to-digital conversion circuitry, nuclear magnetic resonance echoes as digital echo data during and responsive to each of the sequences.

As an example, one or more computer-readable storage media can include computer-executable instructions executable to instruct a computing system to: control radio frequency emission circuitry of a nuclear magnetic resonance unit to emit radio frequency energy according to a first set of parameters that includes a first wait time for an even number of sequence repeats with positive and negative phases and to emit radio frequency energy according to a second set of parameters that includes a second wait time for a single sequence with a single phase, where the second wait time is greater than the first wait time; and acquire, via antenna circuitry and analog-to-digital conversion circuitry, nuclear magnetic resonance echoes as digital echo data during and responsive to each of the sequences.

Figure 20:
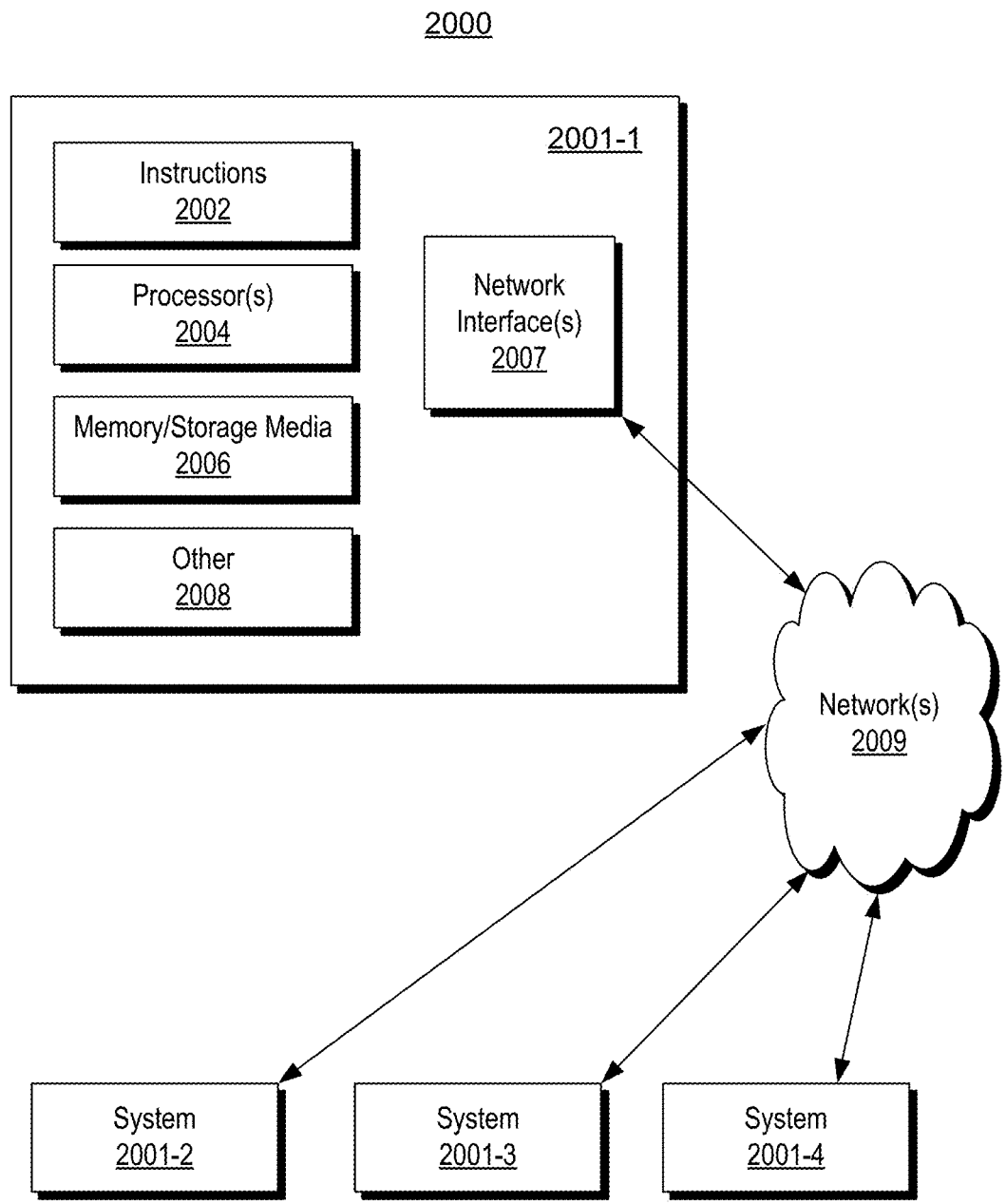
FIG. 20 illustrates examples of computing and networking equipment.

In some embodiments, a method or methods may be executed by a computing system. FIG. 20 shows an example of a system 2000 that can include one or more computing systems 2001-1, 2001-2, 2001-3 and 2001-4, which may be operatively coupled via one or more networks 2009, which may include wired and/or wireless networks.

As an example, a system can include an individual computer system or an arrangement of distributed computer systems. In the example of FIG. 20, the computer system 2001-1 can include one or more sets of instructions 2002, which may be or include processor-executable instructions, for example, executable to perform various tasks (e.g., receiving information, requesting information, processing information, simulation, outputting information, etc.).

As an example, a set of instructions may be executed independently, or in coordination with, one or more processors 2004, which is (or are) operatively coupled to one or more storage media 2006 (e.g., via wire, wirelessly, etc.). As an example, one or more of the one or more processors 2004 can be operatively coupled to at least one of one or more network interface 2007. In such an example, the computer system 2001-1 can transmit and/or receive information, for example, via the one or more networks 2009 (e.g., consider one or more of the Internet, a private network, a cellular network, a satellite network, etc.).

As an example, the computer system 2001-1 may receive from and/or transmit information to one or more other devices, which may be or include, for example, one or more of the computer systems 2001-2, etc. A device may be located in a physical location that differs from that of the computer system 2001-1. As an example, a location may be, for example, a processing facility location, a data center location (e.g., server farm, etc.), a rig location, a wellsite location, a downhole location, etc.

As an example, a processor may be or include a microprocessor, microcontroller, processor component or subsystem, programmable integrated circuit, programmable gate array, or another control or computing device.

As an example, the storage media 2006 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 21:
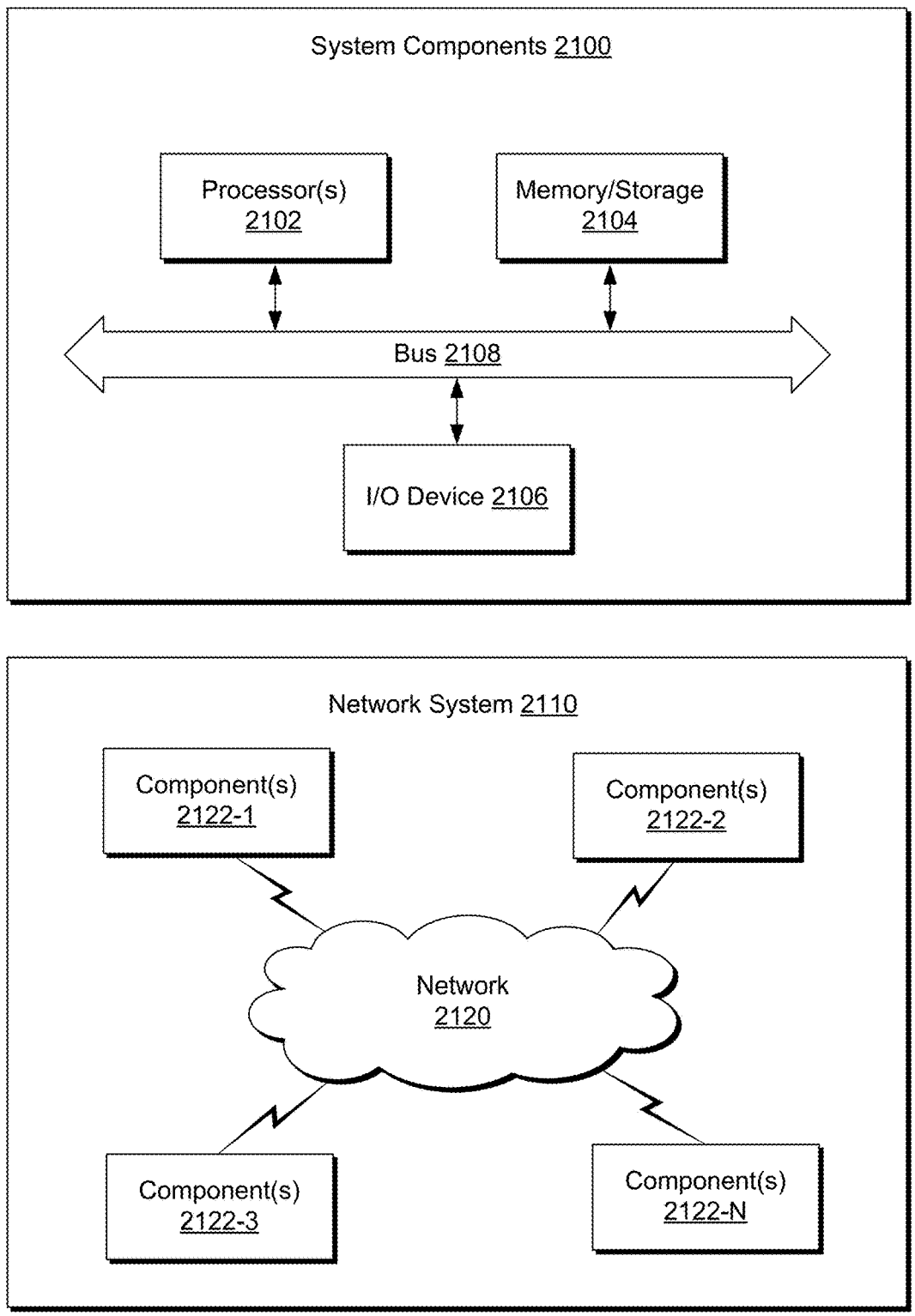
FIG. 21 illustrates example components of a system and a networked system.

FIG. 21 shows components of a computing system 2100 and a networked system 2110. The system 2100 includes one or more processors 2102, memory and/or storage components 2104, one or more input and/or output devices 2106 and a bus 2108. According to an embodiment, instructions may be stored in one or more computer-readable media (e.g., memory/storage components 2104). Such instructions may be read by one or more processors (e.g., the processor(s) 2102) via a communication bus (e.g., the bus 2108), which may be wired or wireless. The one or more processors may execute such instructions to implement (wholly or in part) one or more attributes (e.g., as part of a method). A user may view output from and interact with a process via an I/O device (e.g., the device 2106). According to an embodiment, a computer-readable medium may be a storage component such as a physical memory storage device, for example, a chip, a chip on a package, a memory card, etc.

According to an embodiment, components may be distributed, such as in the network system 2110. The network system 2110 includes components 2122-1, 2122-2, 2122-3, . . . 2122-N. For example, the components 2122-1 may include the processor(s) 2102 while the component(s) 2122-3 may include memory accessible by the processor(s) 2102. Further, the component(s) 2122-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
controlling radio frequency emission circuitry of a nuclear magnetic resonance unit to emit radio frequency energy in at least first and second sequences, the first sequence comprising a phase alternating paired (PAP) sequence including a first wait time between an even number of sequence repeats with an equal number of positive and negative phases, the second sequence comprising a non-phase alternating paired (non-PAP) sequence including a second wait time for a single sequence repeat with a single phase; and
acquiring, via antenna circuitry and analog-to-digital conversion circuitry, nuclear magnetic resonance echoes as digital echo data during and responsive to each of the first and second sequences.

2. The method of claim 1, further comprising:
inverting digital echo data from the first sequence and digital echo data from the second sequence in combination to determine at least one T1 value using the first wait time and the second wait time.

3. The method of claim 2, wherein the inverting digital echo data from the first sequence and digital echo data from the second sequence in combination inverts the following equation to determine the least one T1 value and at least a one T2 value:

$$M(n, WT_k, WT_l) = \frac{1}{2}\sum_{i,j}\left(2 - \exp\left(-\frac{WT_k}{T1_i}\right) - \exp\left(-\frac{WT_l}{T1_i}\right)\right)\exp\left(-\frac{n \cdot TE_k}{T2_j}\right) \times A(T1_i, T2_j)$$

wherein $WT_k$ represents the first wait time, $WT_l$ represents the second wait time, $M(n, WT_k, WT_l)$ represents the digital echo data from the first sequence and the digital echo data from the second sequence, $T1_1$ represents the at least one T1 value, and $T2_1$ represents the at least one T2 value.

4. The method of claim 1, wherein:
the emitted radio frequency energy comprises a third sequence comprising a non-PAP sequence including a third wait time for a single sequence repeat with a single phase, wherein the third wait time is greater than the second wait time; and
the acquiring further comprises acquiring digital echo data during and responsive to the third sequence.

5. The method of claim 4, further comprising:
inverting digital echo data from the first sequence, digital echo data from the second sequence, and digital echo data from the third sequence in combination to determine at least one T1 value using the first wait time, the second wait time, and the third wait time.

6. The method of claim 5, wherein:
the single phase of the third sequence is the same as the single phase of the second sequence; and
the digital echo data from the third sequence is paired with a portion of the digital echo data from the first sequence having an opposing phase to the single phase of the third sequence.

7. The method of claim 5, wherein:
the single phase of the third sequence is opposite the single phase of the second sequence; and
the digital echo data from the third sequence is paired with the digital echo data from the second sequence.

8. The method of claim 1 wherein:
the first sequence comprises an even number of Carr-Purcell-Meiboom-Gill sequence repeats; and
the second sequence comprises a single Carr-Purcell-Meiboom-Gill sequence.

9. A method for logging a subterranean formation, the method comprising:
deploying an NMR logging tool in a wellbore penetrating the subterranean formation, the NMR logging tool including at least one permanent magnet configured to provide a static magnetic field in the subterranean formation, an antenna, and antenna circuitry configured to cause the antenna to emit radio frequency (RF) energy into the formation and receive corresponding nuclear magnetic resonance echoes from the formation;
causing the antenna to emit radio frequency energy in at least first and second sequences, the first sequence comprising a phase alternating paired (PAP) sequence including a first wait time between an even number of sequence repeats with an equal number of positive and negative phases, the second sequence comprising a non phase alternating paired (non-PAP) sequence including a second wait time for a single sequence repeat with a single phase; and
causing the antenna circuitry to receive nuclear magnetic resonance echoes as digital echo data during and responsive to each of the first and second sequences.

10. The method of claim 9, further comprising:
inverting digital echo data from the first sequence and digital echo data from the second sequence in combination to determine at least one T1 value and at least one T2 value using the first wait time and the second wait time.

11. The method of claim 10, further comprising:
generating a log rendering a visual display of a T1 distribution and a T2 distribution corresponding to a depth of the NMR logging tool in the wellbore, the T1 distribution including the at least a one T1 value and the T2 distribution including the at least one T2 value.

12. The method of claim 10, wherein:
the emitted radio frequency energy comprises a third sequence comprising a non-PAP sequence including a third wait time for a single sequence repeat with a single phase, wherein the third wait time is greater than the second wait time; and
the causing the antenna circuitry to receive further comprises receiving digital echo data during and responsive to the third sequence.

13. The method of claim 12, further comprising:
inverting digital echo data from the first sequence, digital echo data from the second sequence, and digital echo data from the third sequence in combination to determine at least one T1 value using the first wait time, the second wait time, and the third wait time.

14. The method of claim 13, wherein:
the single phase of the third sequence is the same as the single phase of the second sequence; and
the digital echo data from the third sequence is paired with a portion of the digital echo data from the first sequence having an opposing phase to the single phase of the third sequence.

15. The method of claim 13, wherein:
the single phase of the third sequence is opposite the single phase of the second sequence; and
the digital echo data from the third sequence is paired with the digital echo data from the second sequence.

16. The method of claim 10 wherein:
the first sequence comprises an even number of Carr-Purcell-Meiboom-Gill sequence repeats; and
the second sequence comprises a single Carr-Purcell-Meiboom-Gill sequence.

17. A method for logging a subterranean wellbore, the method comprising:
deploying an NMR logging tool in a wellbore penetrating the subterranean formation, the NMR logging tool including at least one permanent magnet configured to provide a static magnetic field in the subterranean formation, an antenna, and antenna circuitry configured to cause the antenna to emit radio frequency (RF) energy into the formation and receive corresponding nuclear magnetic resonance echoes from the formation;
causing the RF antenna to emit radio frequency energy in at least first and second sequences, the first sequence comprising a first non phase alternating paired (non-PAP) sequence including a first wait time for a single sequence repeat with a single phase; the second sequence comprising a second non phase alternating paired (non-PAP) sequence including a second wait time for a single sequence repeat with a single phase, wherein the single phase of the second sequence is opposite the single phase of the first sequence; and
causing the antenna circuitry to receive nuclear magnetic resonance echoes as digital echo data during and responsive to each of the first and second sequences.

18. The method of claim 17, further comprising:
inverting digital echo data from the first sequence and digital echo data from the second sequence to determine at least one T2 value using the first wait time and the second wait time.

19. The method of claim 17, wherein
the emitted radio frequency energy comprises a third sequence comprising a non-PAP sequence including a third wait time for a single sequence repeat with a single phase, wherein the third wait time is greater than the second wait time;
the causing the antenna circuitry to receive further comprises receiving digital echo data during and responsive to the third sequence; and
the method further comprises inverting digital echo data from the first sequence, digital echo data from the second sequence, and digital echo data from the third sequence to determine at least one T1 value and at least one T2 value using the first wait time, the second wait time, and the third wait time.

20. The method of claim 19, wherein:
the digital echo data from the third sequence is paired with the digital echo data from the first sequence when the single phase of the third sequence is the same as the single phase of the second sequence; and
the digital echo data from the third sequence is paired with the digital echo data from the second sequence when the single phase of the third sequence is opposite the single phase of the second sequence.

* * * * *